(12) United States Patent
Kando

(10) Patent No.: US 8,710,713 B2
(45) Date of Patent: Apr. 29, 2014

(54) BOUNDARY ACOUSTIC WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1212 days.

(21) Appl. No.: 11/876,129

(22) Filed: Oct. 22, 2007

(65) Prior Publication Data

US 2009/0115287 A1    May 7, 2009

Related U.S. Application Data

(63) Continuation of application No. PCT/JP2006/302693, filed on Feb. 16, 2006.

(30) Foreign Application Priority Data

Apr. 25, 2005   (JP) ................... 2005-126674

(51) Int. Cl.
*H03H 9/02* (2006.01)

(52) U.S. Cl.
CPC ......... *H03H 9/0222* (2013.01); *H03H 9/02559* (2013.01)
USPC .................................... 310/313 B

(58) Field of Classification Search
CPC ................. H03H 9/0222; H03H 9/02559
USPC ........ 310/313 R, 313 A, 313 B, 313 C, 313 D
See application file for complete search history.

(56) References Cited

U.S. PATENT DOCUMENTS

| 5,065,065 | A  | 11/1991 | Hikita et al. |
| 7,151,424 | B2 | 12/2006 | Kando |
| 7,180,222 | B2 | 2/2007  | Kando et al. |
| 7,208,860 | B2 | 4/2007  | Kadota et al. |
| 2003/0151329 | A1 | 8/2003 | Kadota et al. |

(Continued)

FOREIGN PATENT DOCUMENTS

| EP | 1 610 460 A1 | 12/2005 |
| JP | 08-204493 A  | 8/1996  |

(Continued)

OTHER PUBLICATIONS

Official communication issued in the International Application No. PCT/JP2006/302693, mailed on May 23, 2006.

(Continued)

*Primary Examiner* — Derek Rosenau
(74) *Attorney, Agent, or Firm* — Keating & Bennett, LLP

(57) ABSTRACT

A boundary acoustic wave device efficiently traps the vibrational energy of boundary acoustic waves and exhibits a high electromechanical coupling coefficient, and is consequently not affected by higher-order modes. The boundary acoustic wave device includes a first medium having piezoelectric characteristics, a non-electroconductive second medium, and a third medium through which slow transverse waves propagate at a lower acoustic velocity than slow transverse waves propagating through the first and second media. The first medium, the third medium, and the second medium are stacked in that order. An IDT is disposed between the first medium and the third medium. The IDT includes a metal layer made of a metal having a density $\rho$ in the range of about 3000 kg/m$^3$ to about 21500 kg/m$^3$. The IDT has electrode fingers arranged at a pitch of $\lambda$ and has a thickness H1 satisfying the relationship $0.006\lambda \leq H1 \leq 0.2\lambda$, and the third medium has a thickness H2 satisfying the relationship $H1 < H2 \leq 0.7\lambda$.

10 Claims, 28 Drawing Sheets

(56) References Cited

U.S. PATENT DOCUMENTS

| | | |
|---|---|---|
| 2006/0071579 A1 | 4/2006 | Kando |
| 2006/0112537 A1 | 6/2006 | Kadota et al. |
| 2006/0175928 A1* | 8/2006 | Kando ..................... 310/311 |
| 2007/0096592 A1* | 5/2007 | Kadota et al. ............ 310/313 A |
| 2007/0108868 A1 | 5/2007 | Kando et al. |

FOREIGN PATENT DOCUMENTS

| | | | | |
|---|---|---|---|---|
| JP | 10-335974 A | | 12/1998 | |
| WO | 98/52279 A1 | | 11/1998 | |
| WO | 2004/070946 A1 | | 8/2004 | |
| WO | WO 2004/095699 | * | 11/2004 | ............ H03H 9/145 |
| WO | WO 2005/034347 | * | 4/2005 | ............ H03H 9/145 |

OTHER PUBLICATIONS

"Danseiha Soshi Gijutsu Handbook (Elastic Wave Device Technology Handbook)" (Japan Society for the Promotion of Science, Acoustic Wave Device Technology the 150th Committee, 1st Version 1st printing, published on Jan. 30, 2001, p. 549).

Campbell et al., "A Method for Estimating Optimal Crystal Cuts and Propagation Directions for Excitation and Propagation Directions for Excitation of Piezoelectric Surface Waves" (IEEE Trans. Sonics and Ultrason., vol. SU-15 (Oct. 1968) pp. 209-217.

Shimizu; "Saw Propogation Characteristics on LiTaO3 With Arbitrary Cut," (Journal of the Acoustical Society of Japan) vol. 36, No. 3, 1980, pp. 140-145.

Toshio Irino, et al.: "Propagation Boundary Acoustic Waves Along a ZnO Layer Between Two Materials," IEICE Material, vol. 86, No. 177, US86-39, 1986, pp. 47-54.

Official Communication issued in corresponding European Patent Application No. 06713834.7, mailed on Jan. 24, 2012.

Cullen et al., "Surface and Interface Acoustic Waves in SiO2/YX-LiNbO3," Applied Physics Letters, American Institute of Physics, vol. 44, No. 2, Jan. 15, 1984, pp. 182-184.

Yamaguchi et al., "Highly Piezoelectric Boundary Waves in Si/SiO2/LiNbO3 Structure," IEEE International Frequency Control Symposium, May 27, 1998, pp. 484-488.

Official Communication issued in corresponding European Patent Application No. 06713834.7, mailed on Nov. 29, 2012.

Yamanouchi et al., "Applications for Piezoelectric Leaky Surface Waves," 1990 Ultrasonics Symposium, Dec. 4, 1990, pp. 11-18.

* cited by examiner

BOUNDARY ACOUSTIC WAVE DEVICE

BACKGROUND OF THE INVENTION

1. Field of the Invention

The present invention relates to boundary acoustic wave devices using boundary acoustic waves propagating along an interface between different media, and more particularly, to a boundary acoustic wave device including a multilayer structure formed by stacking at least three media.

2. Description of the Related Art

A variety of devices using boundary acoustic waves, such as resonators and band-pass filters, have been proposed. Boundary acoustic waves propagate along the interface between different media. Therefore, the packages of boundary acoustic wave devices can be simpler than those of surface acoustic wave devices using surface acoustic waves. The boundary acoustic wave device thus can be more simplified, and have reduced thickness.

A non-patent literature document (Toshio IRINO, et al., "Propagation Boundary Acoustic Waves Along a ZnO Layer Between Two Materials", IEICE Material, Vol. 86, No. 177, US86-39, 1986, pp. 47-54), discloses a boundary acoustic wave device. The boundary acoustic wave device has a multilayer structure including a first medium of $SiO_2$ or Si, a ZnO third medium and a $SiO_2$ second medium stacked in that order. An IDT (interdigital transducer) is disposed along the interface of the first medium and the third medium.

The vibrational energy of boundary acoustic waves is trapped in the third medium made of ZnO in which acoustic velocity becomes low, and thus boundary acoustic waves are propagated. In this device, the IDT is made of Al.

WO98/52279 discloses a boundary acoustic wave having a multilayer structure including a first medium, a third medium and a second medium stacked in that order as in the non-patent literature document discussed above, the first medium is made of $LiNbO_3$, the third medium is made of $SiO_2$, and the second medium is made of SiN. An Al IDT is disposed between the first medium and the third medium.

The boundary acoustic wave devices disclosed in the two prior art references discussed above each have an IDT made of Al. In boundary acoustic wave devices using Al electrodes, the acoustic velocity of transverse waves tends to be higher, and the trapping efficiency of the vibrational energy of the boundary acoustic waves tends to be lower, in comparison with boundary acoustic wave devices using electrodes made of a metal having a higher density than Al, such as Au, Ag, or Cu.

For developing a boundary acoustic wave device, in general, it has been considered that the trapping of the vibrational energy mainly depends on the third medium in which the acoustic velocity of transverse waves is low, and nobody has thought that trapping of the vibrational energy can be achieved by appropriately selecting the material of electrodes. Accordingly, the trapping efficiency of the vibrational energy is not satisfactory, and the thicknesses of the first and second media are increased. It has been thus considered that boundary acoustic wave devices are difficult to reduce in size.

While many of the materials used as the first to third media propagating boundary acoustic waves have negative temperature coefficients of acoustic velocity (TCV), $SiO_2$ has a positive TCV. Hence, a combination of $SiO_2$ and a material having a negative TCV can make the TCV value zero or close to zero.

The frequency temperature coefficient TCF of the boundary acoustic wave device results from the subtraction of the linear expansion coefficient of the boundary wave propagation path from the TCV. Thus, a combination of $SiO_2$ and another medium material can achieve a boundary acoustic wave device having a low frequency temperature coefficient TCF.

The IDT of such a known boundary acoustic wave device is made of Al, as described in the prior references mentioned above. In a structure including a $SiO_2$ third medium and an Al IDT, the $SiO_2$ fills the spaces between the Al strips arranged at periodic intervals of the IDT and the reflectors. The difference in density between Al and $SiO_2$ is small, and the difference in acoustic impedance between them is also small. Accordingly, the reflection of the boundary acoustic waves from the IDT and reflectors is reduced for each Al strip.

If the reflection from each of the strips, which are electrode fingers, is reduced, a large number of electrode fingers are required in order for the reflectors to ensure a sufficient reflection coefficient. Accordingly, the reflectors are inevitably large, and the resulting boundary acoustic wave device therefore must be large.

In addition, if the reflection from the IDT is reduced for each strip, the shape factor of a longitudinally coupled resonator-type boundary acoustic wave filter or the directivity of the EWC SPUDT of a transversal boundary acoustic wave filter is degraded, for example.

In a boundary acoustic wave device having a multilayer structure of second medium/third medium/IDT/first medium, boundary acoustic waves propagate with the vibrational energy being trapped in the third medium and the IDT. If the thickness of the third medium is relatively large with the wavelength of propagating boundary waves, higher-order modes are relatively strongly excited. Therefore, the thickness of the third medium is preferably smaller than or equal to the wavelength of a single wave of the boundary acoustic waves.

If the third medium is formed by deposition, such as sputtering, it is difficult to increase the thickness of the third medium to a sufficiently larger value than the thickness of the strips of the IDT and reflectors. A third medium having a small thickness may be cracked due to the unevenness between regions having the strips and regions having no strips.

SUMMARY OF THE INVENTION

In order to overcome the problems described above, preferred embodiments of the present invention provide a boundary acoustic wave device that has a multilayer structure including a first medium, a third medium and a second medium stacked in that order, that can efficiently trap the vibrational energy of boundary acoustic waves in the third medium so as to exhibit a low boundary acoustic wave propagation loss and a high electromechanical coupling coefficient so as not to be affected by higher-order modes that produce undesired spurious responses, and thus can produce superior resonance characteristics or filter properties, and that is not easily cracked in the third medium.

According to a preferred embodiment of the present invention, a boundary acoustic wave device includes a multilayer structure including a first medium having piezoelectric characteristics, a non-electroconductive second medium, and a third medium through which slow transverse waves propagate at a lower acoustic velocity than slow transverse waves propagating through the first and second media. The first medium, the third medium, and the second medium are stacked in that order. An IDT disposed between the first medium and the third medium. The IDT preferably includes a metal layer made of a metal having a density ρ in the range of about 3000 kg/m³ to about 21500 kg/m³. The IDT has electrode fingers at a pitch of λ and has a thickness H1 satisfying the relationship of approximately 0.006λ≤H1≤0.2λ, and the third medium has a thickness H2 satisfying the relationship of approximately H1<H2≤0.7λ.

In a specific preferred embodiment of the boundary acoustic wave device according to the present invention, the third medium preferably has a thickness H2 satisfying the relationship of approximately H1<H2<0.5λ.

In another specific preferred embodiment of the boundary acoustic wave device according to the present invention, the third medium is made of $SiO_2$ or a material mainly containing $SiO_2$.

In still another specific preferred embodiment of the boundary acoustic wave device according to the present invention, the first medium is preferably made of $LiNbO_3$ and has Euler angles [φ, θ, ψ] satisfying the relationships approximately −25°<φ<25°, approximately 92°<θ<114°, and approximately −60°<ψ<60°.

In still another specific preferred embodiment of the boundary acoustic wave device according to the present invention, the first medium is made of $LiNbO_3$ and has Euler angles [φ, θ, ψ] satisfying the relationships approximately −25°<φ<25°, approximately 92°<θ<114°, and approximately 60°<ψ<120°.

In a still further specific preferred embodiment of the boundary acoustic wave device according to the present invention, the first medium is made of LiNbO3 and has Euler angles [φ, θ, φ] satisfying approximately −32°<φ<32°, approximately 15°<θ<41°, and approximately −35°<ψ<35°.

In a still further specific preferred embodiment of the boundary acoustic wave device according to the present invention, the IDT is preferably made of a metal selected from the group consisting of Pt, Au, Cu, Ag, Ni, Ti, Fe, W, Ta, and alloys mainly containing those metals.

In a still further specific preferred embodiment of the boundary acoustic wave device according to the present invention, the IDT has a structure formed by alternately disposing a first metal layer having a relatively high density and a second metal layer having a relatively low density.

In a still another specific preferred embodiment of the boundary acoustic wave device of the present invention, the first metal layer is disposed at the first medium side.

In a still another specific preferred embodiment of the boundary acoustic wave device of the present invention, the first medium and/or the second medium has a multilayer structure including a plurality of medium layers.

The boundary acoustic wave device according to various preferred embodiments of the present invention includes a multilayer structure and an IDT. The multilayer structure includes a first medium having piezoelectric characteristics, a non-electroconductive second medium, and a third medium through which slow transverse waves propagate at a lower acoustic velocity than slow transverse waves propagating through the first and second media. The first medium, the third medium and the second medium are stacked in that order to define the multilayer structure. The IDT is disposed between the first medium and the third medium. Since the IDT is preferably made of a metal having a density ρ in the range of about 3000 kg/m³ to about 21500 kg/m³, the propagation loss of boundary acoustic waves can be reduced, and the loss in the boundary acoustic wave device can be reduced.

Since the thickness H1 of the IDT is preferably in the range of approximately 0.006λ≤H1≤0.2λ, the electromechanical coupling coefficient is sufficient for boundary acoustic waves. Also, the difference in acoustic velocity between SH boundary waves and P+SV boundary waves can be increased. When SH boundary waves are used in the main mode, spurious responses of P+SV boundary waves, which are undesirable in the SH boundary waves, are significantly reduced. In addition, since the thickness H2 of the third medium is preferably in the range of approximately H1<H2≤0.7λ, higher-order spurious responses of SH boundary waves can also be reduced.

Thus, preferred embodiments of the present invention can provide a low-loss boundary acoustic wave device having a high enough electromechanical coupling coefficient $K^2$ such that the size, particularly the thickness, can be reduced, and such that superior resonance characteristics or filter properties are achieved.

If H1<H2<0.5λ is satisfied, higher-order spurious responses of SH boundary waves can be more efficiently reduced and more enhanced resonance characteristics or filter properties can be achieved.

The third medium may be made of $SiO_2$ or a $SiO_2$-based material and the $SiO_2$ has a positive TCV. On the other hand, many of the materials of the media of boundary acoustic wave devices have negative TCVs. Hence, the third medium made of $SiO_2$ or a $SiO_2$-based material has a low frequency temperature coefficient TCF and the resulting boundary acoustic wave device can exhibit superior temperature characteristics.

If the first medium is made of $LiNbO_3$ and has Euler angles φ, θ, and ψ in the ranges of approximately −25°<φ<25°, approximately 92°<θ<114°, and approximately −60°<ψ<60°, the electromechanical coupling coefficient $K^2$ for P+SV boundary waves can be sufficiently reduced, so that SH boundary waves can be used to achieve superior resonance characteristics or filter properties.

If the first medium is made of $LiNbO_3$ and has Euler angles φ, θ, and ψ in the ranges of approximately −25°<φ<25°, approximately 92°<θ<114°, and approximately 60°<ψ<120°, the electromechanical coupling coefficient $K^2$ for SH boundary waves can be sufficiently reduced, so that P+SV boundary waves can be used to achieve superior resonance characteristics or filter properties.

If at least one of the second metal layers contains Al, which has a low electrical resistance, the electrical resistance loss due to the electrode fingers can be reduced more effectively.

If the first medium is made of $LiNbO_3$ and has Euler angles φ, θ, and ψ in the ranges of approximately −32°<φ<32°, approximately 15°<θ<41°, and approximately −35°<ψ<35°, the electromechanical coupling coefficient $K^2$ for SH boundary waves can be sufficiently reduced, so that P+SV boundary waves can be used to achieve superior resonance characteristic or filter properties.

The IDT can be made of a metal selected from the group consisting of Pt, Au, Cu, Ag, Ni, Ti, Fe, W, Ta, and alloys mainly containing those metals. Since those metals have higher densities than Al, the propagation loss of boundary acoustic waves can be reduced and thus a low-loss boundary acoustic wave device can be achieved.

The IDT may be defined by a single metal layer, or a multilayer structure including a first metal layer having a relatively high density and a second metal layer having a relatively low density. If the multilayer structure is formed by alternately disposing the first metal layers and the second metal layers, the thickness of the electrode fingers can be increased on the condition that the propagation loss of boundary acoustic waves is reduced. Thus, the electrical resistance loss due to the electrode fingers can be reduced.

The first metal layer may be disposed at the first medium side. Hence, the first metal layer having a relatively high density is disposed at the side of the first medium having a low acoustic velocity. Accordingly, a larger amount of energy of boundary acoustic waves is distributed at the first medium side. If the first medium is made of a piezoelectric material, the electromechanical coupling coefficient $K_2$ can be increased.

If the first medium and/or the second medium have a multilayer structure defined by a plurality of medium layers including, for example, a compressive stress layer and a tensile stress layer, the total stress can be reduced by the interaction of these stresses. If layers producing different acoustic velocities are stacked in the region in which the vibrational energy of boundary waves exist, the frequency can be controlled by adjusting the thickness of either the first or the second medium by etching, such as ion beam etching. If a plurality of layers each have a sufficiently lower thickness than $\lambda$, the multilayer structure can produce an intermediate acoustic velocity for the layers of the multilayer structure.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
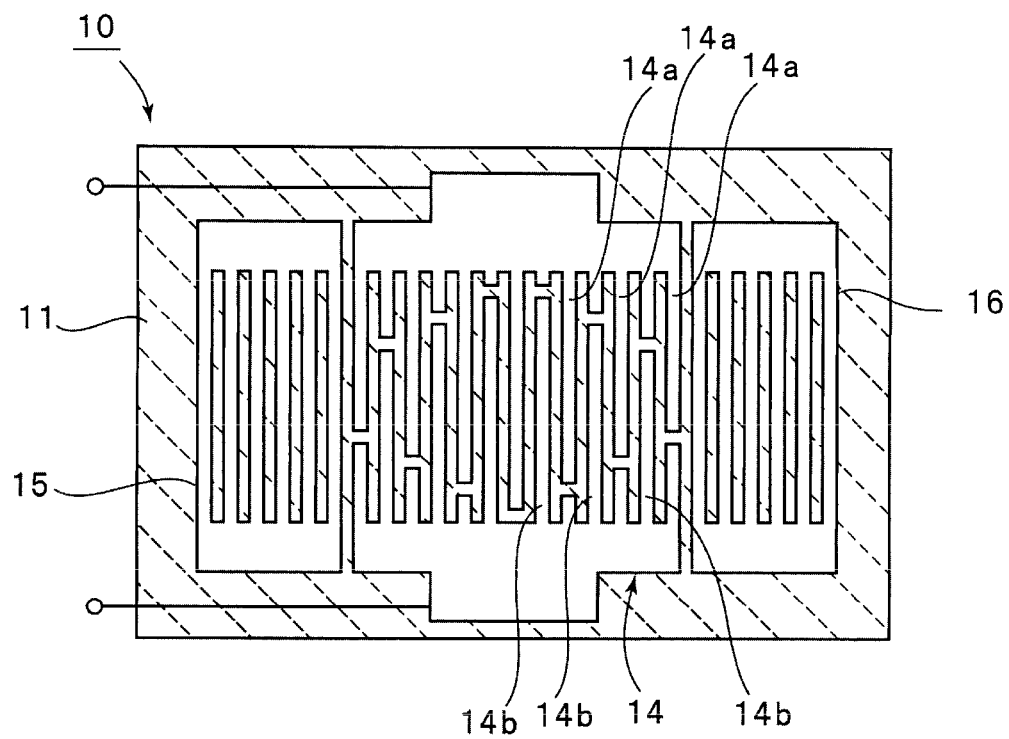
FIG. 1 is a sectional plan view of a boundary acoustic wave device according to a preferred embodiment of the present invention.

The present invention will become clear from the description of specific preferred embodiments of the present invention with reference to the drawings.

In the Description, the Euler angles, the crystallographic axis, and equivalent Euler angles refer to the following.

Euler Angles

In the Description, the Euler angles (φ, θ, ψ) representing the direction of the cut surface of the substrate and the propagation direction of the boundary waves are based on the right-handed Euler angles described in a document "Danseiha Soshi Gijutsu Handbook (Acoustic Wave Device Technology Handbook)" (Japan Society for the Promotion of Science, Acoustic Wave Device Technology the 150th Committee, 1st Version 1st printing, published on Jan. 30, 2001, p. 549). Specifically, in LN crystallographic axes X, Y, and Z, the X axis is rotated φ turn counterclockwise about the Z axis to define a Xa axis. Subsequently, the Z axis is rotated θ turn counterclockwise about the Xa axis to define a Z' axis. A plane including the Xa axis whose normal is the Z' axis is defined as the cut surface. The propagation direction of the boundary waves is set to be the direction of the X' axis that is defined by rotating the Xa axis ψ turn counterclockwise about the Z' axis.

Crystallographic Axis

As for the LiNbO$_3$ crystallographic axes X, Y, and Z defining the initial Euler angles, the Z axis is set to be parallel to the c axis, the X axis is set to be parallel to one of the equivalent a axes extending in three directions, and the Y axis is set to be the normal of a plane including the X axis and the Z axis.

Equivalent Euler Angles

The present invention requires only that the LiNbO$_3$ Euler angles (φ, θ, ψ) be crystallographically equivalent. For example, a document (Nihon Onkyo Gakkai-shi (Journal of the Acoustical Society of Japan) Vol. 36, No. 3, 1980, pp. 140-145) has taught that LiNbO$_3$ belongs to the trigonal 3m point group, and Equation [4] therefore holds.

$$F(\phi, \theta, \psi) = F(60° - \phi, -\theta, \psi) \quad [4]$$
$$= F(60° + \phi, -\theta, 180° - \psi)$$
$$= F(\phi, 180° + \theta, 180° - \psi)$$
$$= F(\phi, \theta, 180° + \psi)$$

In the equation, F represents a boundary wave property, such as electromechanical coupling coefficient $K^2$, propagation loss, TCF, PFA, or a natural unidirectional property. For example, when the propagation direction is reversed, the PFA natural unidirectional properties are changed in plus/minus sign, but their absolute values do not change; hence they are estimated to be practically equivalent. Although one of the documents referred to herein discusses surface waves, the same applies to the boundary waves in terms of crystalline symmetry.

For example, the propagation characteristics of boundary waves with Euler angles of (30°, θ, ψ) are equivalent to those of boundary waves with Euler angles of (90°, 180°−θ, 180°−ψ). For example, the propagation characteristics of boundary waves with Euler angles (30°, 90°, 45°) are equivalent to those of boundary waves with Euler angles shown in Table 1.

Although the constants of conductive material used for the calculations in preferred embodiments of the present invention are those of polycrystals, epitaxial films or the like can also produce boundary wave propagation characteristics to the extent that problems do not occur in practice according to Equation [4] because the crystal orientation dependence of the substrate is more dominant to the boundary wave characteristics than the crystal orientation dependence of the layers.

TABLE 1

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |

TABLE 1-continued

| φ (°) | θ (°) | ψ (°) |
|---|---|---|
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225 |

Figure 2:
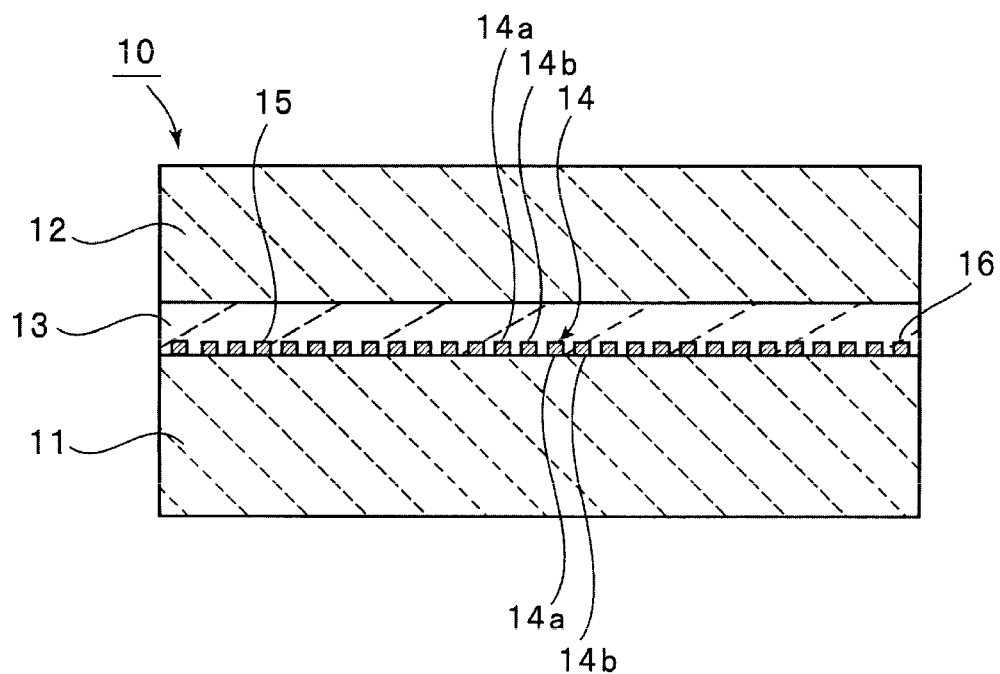
FIG. 2 is a sectional front view of a boundary acoustic wave device according to a preferred embodiment of the present invention.
Figure 3:
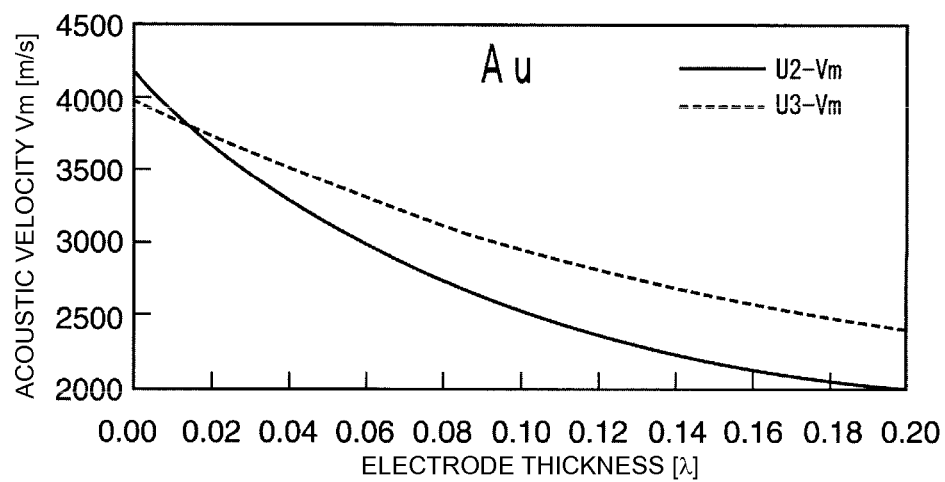
FIG. 3 is a representation of the relationship between the thickness of Au electrodes including the IDT and the acoustic velocity Vm of boundary acoustic waves in a SiN/SiO$_2$/IDT/LiNbO$_3$ multilayer structure.
Figure 4:
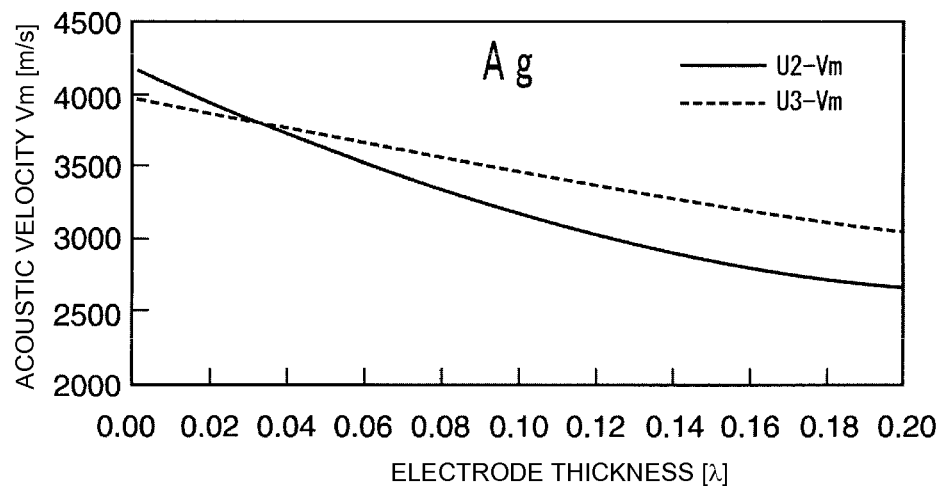
FIG. 4 is a representation of the relationship between the thickness of Ag electrodes including the IDT and the acoustic velocity Vm of boundary acoustic waves in a SiN/SiO$_2$/IDT/LiNbO$_3$ multilayer structure.
Figure 5:
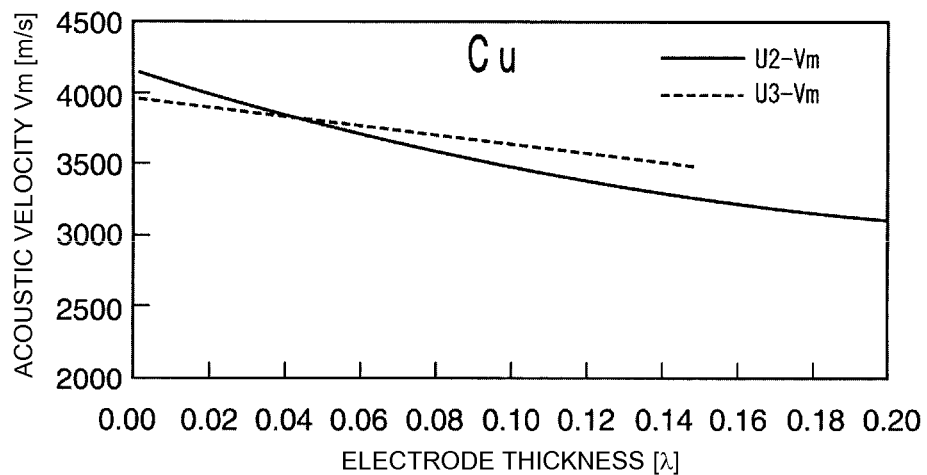
FIG. 5 is a representation of the relationship between the thickness of Cu electrodes including the IDT and the acoustic velocity Vm of boundary acoustic waves in a SiN/SiO$_2$/IDT/LiNbO$_3$ multilayer structure.
Figure 6:
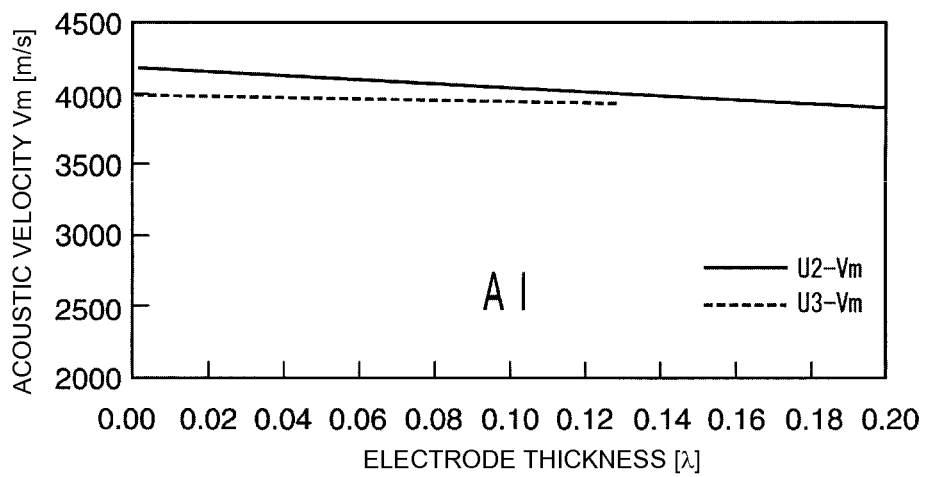
FIG. 6 is a representation of the relationship between the thickness of Al electrodes including the IDT and the acoustic velocity Vm of boundary acoustic waves in a SiN/SiO$_2$/IDT/LiNbO$_3$ multilayer structure.
Figure 7:
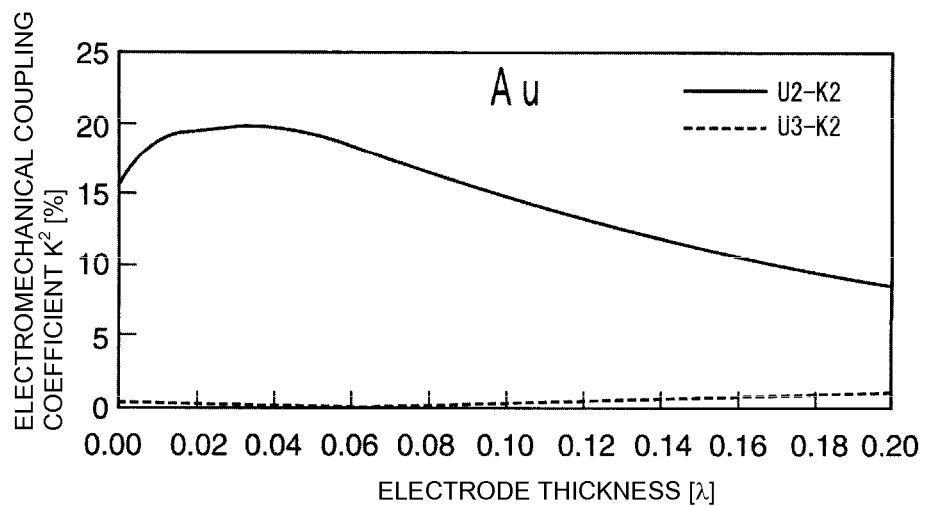
FIG. 7 is a representation of the relationship between the thickness of Au electrodes including the IDT and the electromechanical coupling coefficient $K^2$ (%) for boundary acoustic waves in a SiN/SiO$_2$/IDT/LiNbO$_3$ structure.
Figure 8:
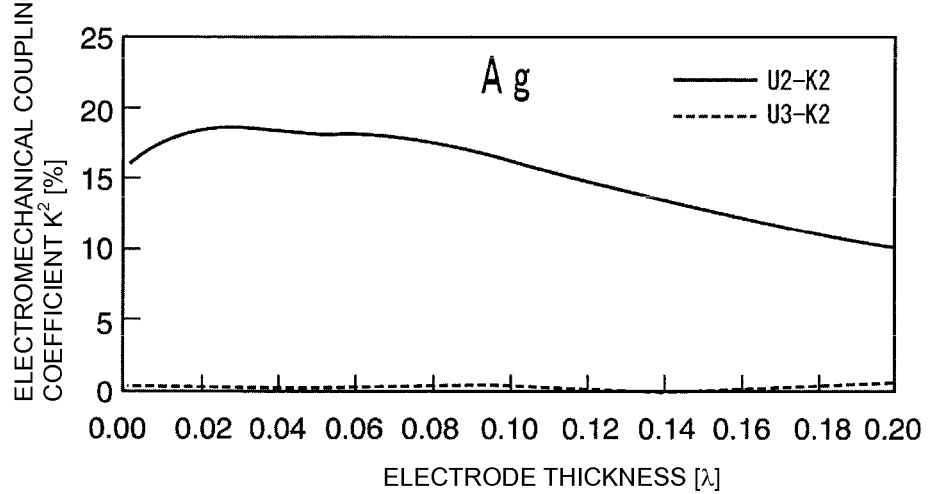
FIG. 8 is a representation of the relationship between the thickness of Ag electrodes including the IDT and the electromechanical coupling coefficient $K^2$ (%) for boundary acoustic waves in a SiN/SiO$_2$/IDT/LiNbO$_3$ multilayer structure.
Figure 9:
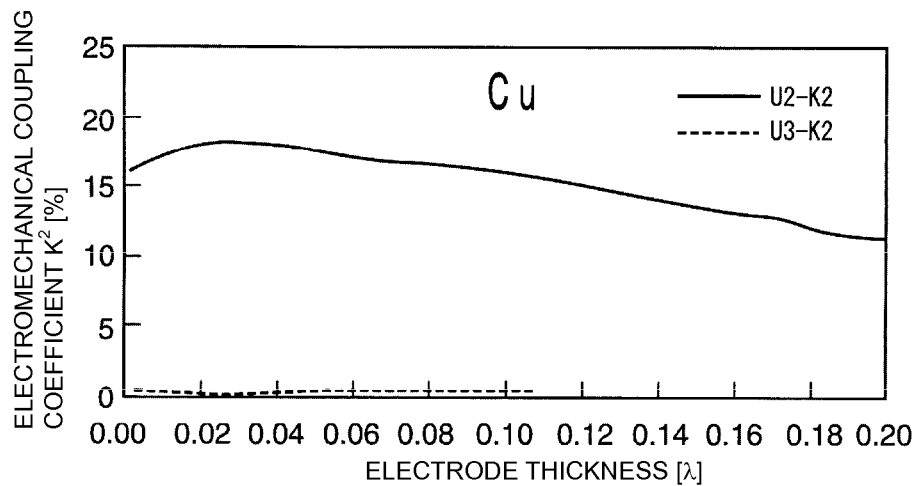
FIG. 9 is a representation of the relationship between the thickness of Cu electrodes including the IDT and the electromechanical coupling coefficient $K^2$ (%) for boundary acoustic waves in a SiN/SiO$_2$/IDT/LiNbO$_3$ multilayer structure.
Figure 10:
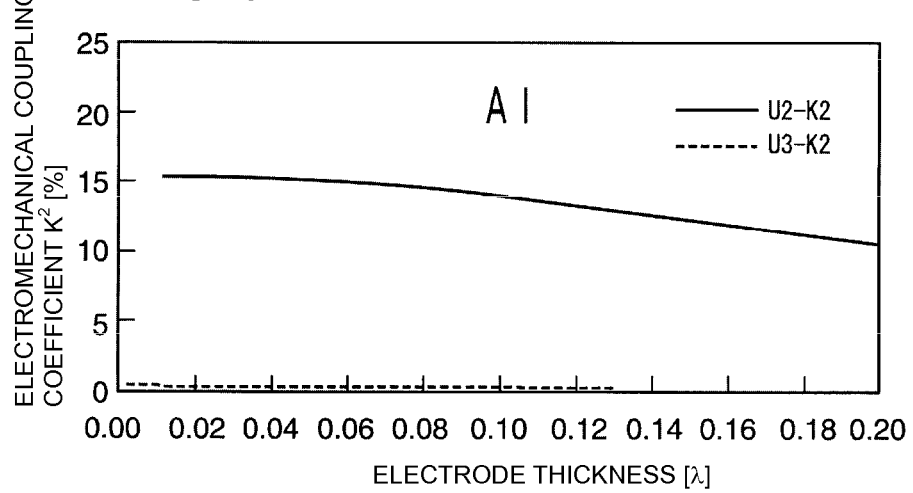
FIG. 10 is a representation of the relationship between the thickness of Al electrodes including the IDT and the electromechanical coupling coefficient $K^2$ (%) for boundary acoustic waves in a SiN/SiO$_2$/IDT/LiNbO$_3$ multilayer structure.
Figure 11:
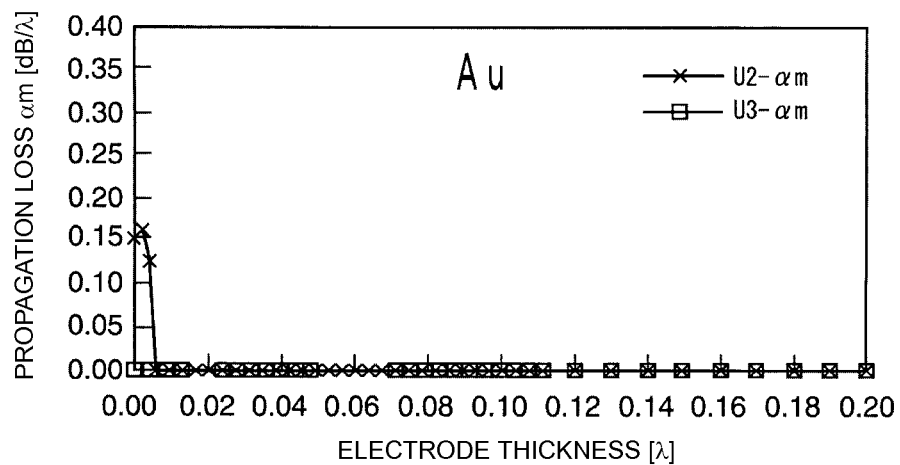
FIG. 11 is a representation of the relationship between the thickness of Au electrodes including the IDT and the propagation loss $\alpha$m (dB/$\lambda$) of boundary acoustic waves in a SiN/SiO$_2$/IDT/LiNbO$_3$ multilayer structure.
Figure 12:
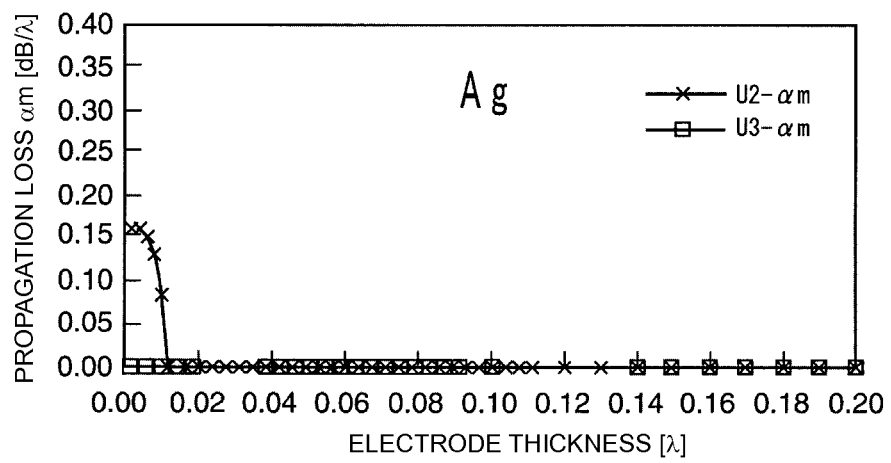
FIG. 12 is a representation of the relationship between the thickness of Ag electrodes including the IDT and the propagation loss $\alpha$m (dB/$\lambda$) of boundary acoustic waves in a SiN/SiO$_2$/IDT/LiNbO$_3$ multilayer structure.
Figure 13:
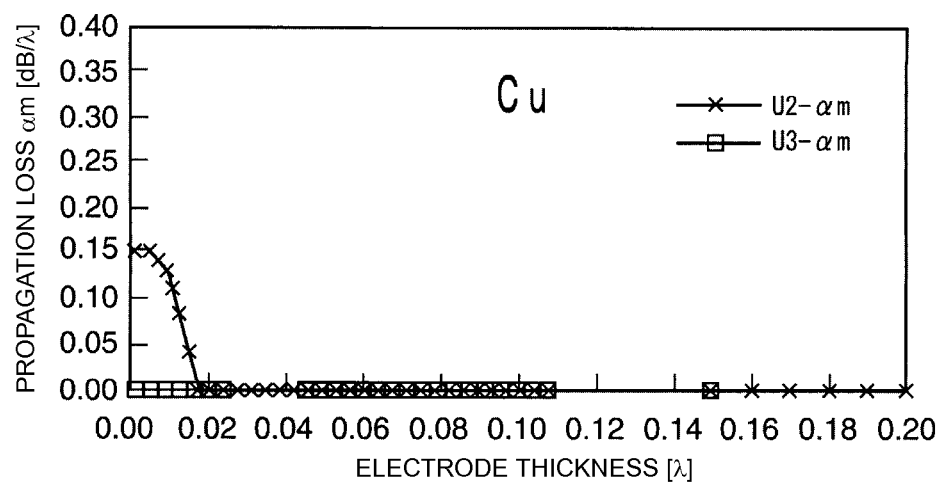
FIG. 13 is a representation of the relationship between the thickness of Cu electrodes including the IDT and the propagation loss $\alpha$m (dB/$\lambda$) of boundary acoustic waves in a SiN/SiO$_2$/IDT/LiNbO$_3$ multilayer structure.
Figure 14:
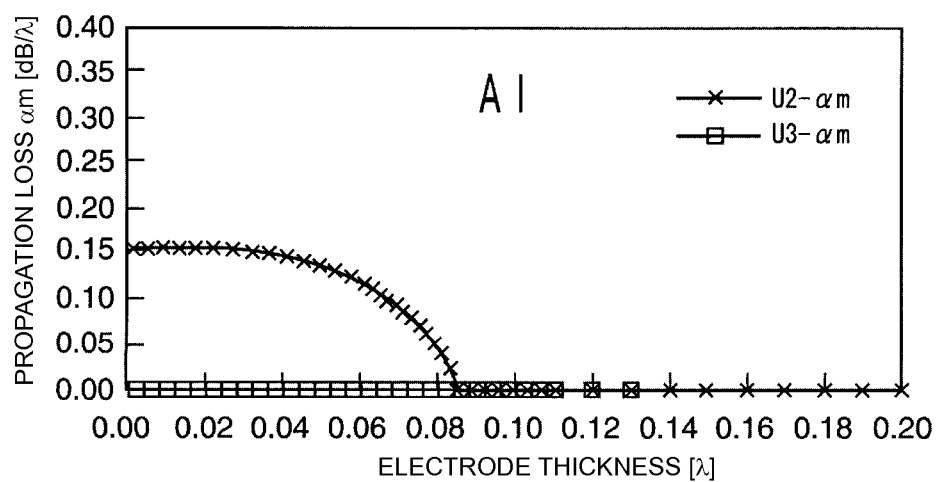
FIG. 14 is a representation of the relationship between the thickness of Al electrodes including the IDT and the propagation loss $\alpha$m (dB/$\lambda$) of boundary acoustic waves in a SiN/SiO$_2$/IDT/LiNbO$_3$ multilayer structure.
Figure 15:
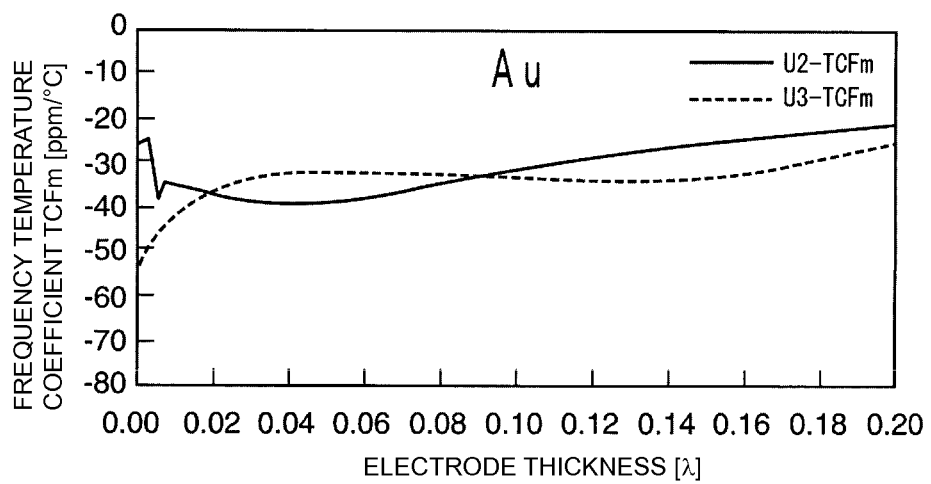
FIG. 15 is a representation of the relationship between the thickness of Au electrodes including the IDT and the frequency temperature coefficient TCFm (ppm/° C.) for boundary acoustic waves in a SiN/SiO$_2$/IDT/LiNbO$_3$ multilayer structure.
Figure 16:
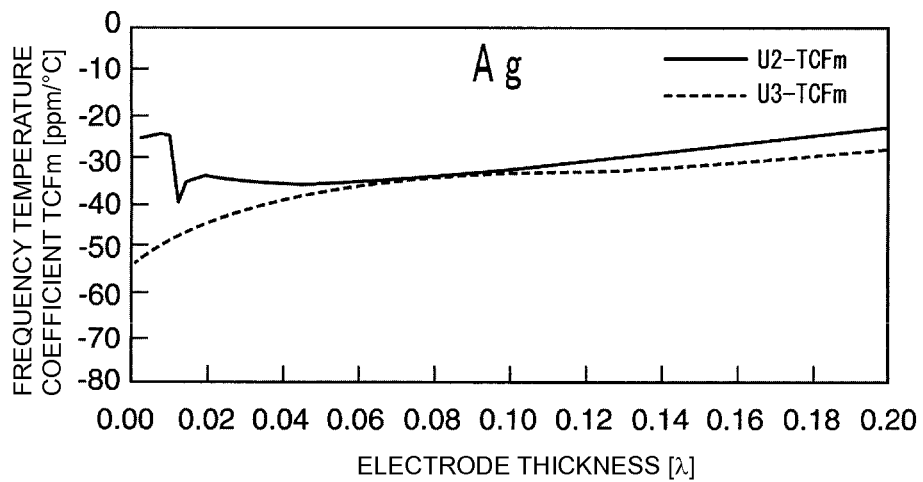
FIG. 16 is a representation of the relationship between the thickness of Ag electrodes including the IDT and the frequency temperature coefficient TCFm (ppm/° C.) for boundary acoustic waves in a SiN/SiO$_2$/IDT/LiNbO$_3$ multilayer structure.
Figure 17:
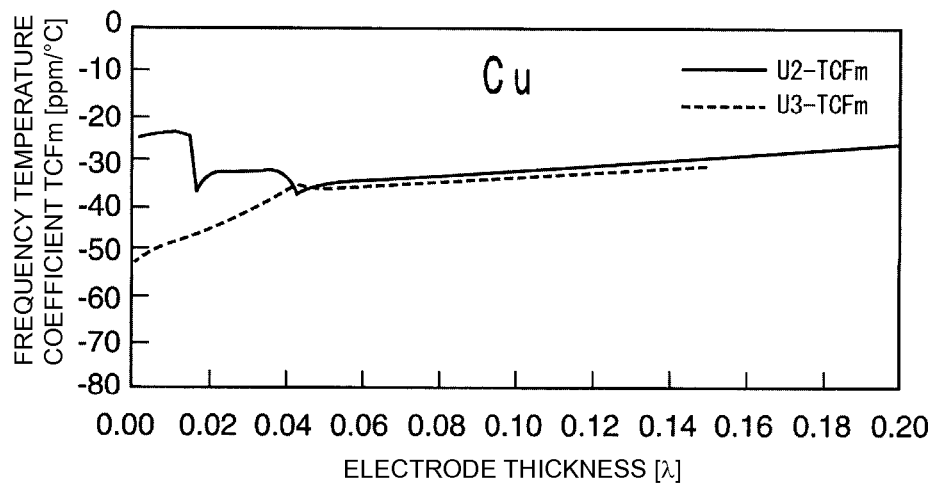
FIG. 17 is a representation of the relationship between the thickness of Cu electrodes including the IDT and the frequency temperature coefficient TCFm (ppm/° C.) for boundary acoustic waves in a SiN/SiO$_2$/IDT/LiNbO$_3$ multilayer structure.
Figure 18:
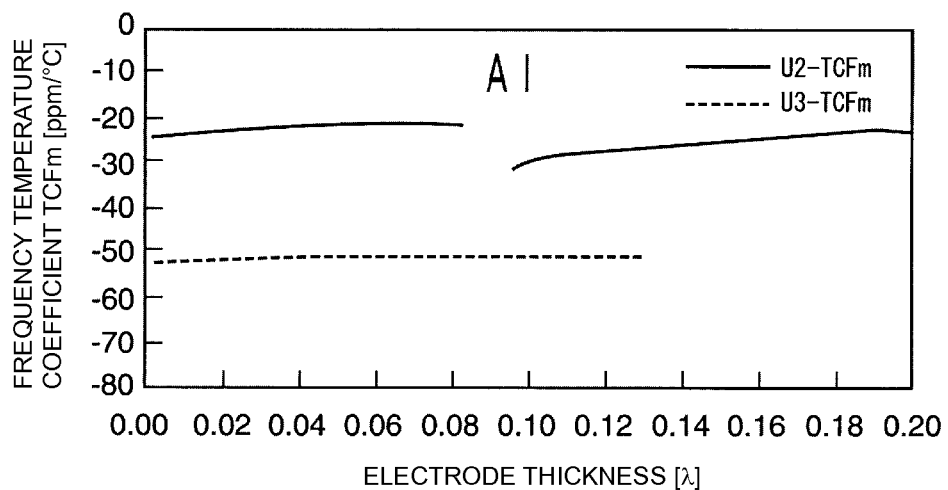
FIG. 18 is a representation of the relationship between the thickness of Al electrodes including the IDT and the frequency temperature coefficient TCFm (ppm/° C.) for boundary acoustic waves in a SiN/SiO$_2$/IDT/LiNbO$_3$ multilayer structure.

FIG. 1 is a schematic sectional plan view showing the structure of the electrodes of a boundary acoustic wave device according to a preferred embodiment of the present invention, and FIG. 2 is a sectional front view of the boundary acoustic wave device.

The boundary acoustic wave device 10 of the present preferred embodiment includes a third medium 13 and a second medium 12 formed in that order on a first medium 11 having piezoelectric characteristics. An IDT 14 and reflectors 15 and 16 are disposed along the interface between the first medium 11 and the third medium 13. In other words, electrodes are disposed along the interface between the first and third media 11 and 13.

The IDT 14 has a plurality of electrode fingers 14a and a plurality of electrode fingers 14b that are alternately disposed between other electrode fingers. The electrode fingers 14a are electrically connected to one bus bar, and the other electrode fingers 14b are electrically connected to the other bus bar. In the present preferred embodiment, the IDT 14 is weighted by varying the finger overlap amount.

The reflectors 15 and 16 are disposed outside the direction perpendicular to the direction in which the fingers 14a and 14b of the IDT 14 extend, that is, at both sides of the direction at which boundary acoustic waves propagate. The IDTs 15 and 16 each have a plurality of electrode fingers extending in the direction perpendicular to the direction in which the boundary acoustic waves propagate, and the ends of these electrode fingers are closed together. While the ends of the reflectors are closed together in the present preferred embodiment, OPEN reflectors having open ends may be used.

In the boundary acoustic wave device 10, the third medium 13 in which slow transverse waves used in the device have a relatively low acoustic velocity is disposed between the first and second media 11 and 12 in which the slow transverse waves have relatively high acoustic velocities. Consequently, boundary acoustic waves are propagated while their vibrational energy is trapped in the third medium 13 exhibiting a relatively low acoustic velocity. More specifically, boundary acoustic waves are propagated in the direction perpendicular to the electrode fingers 14a and 14b and substantially parallel to the plane on which the IDT 14 is formed, by trapping the vibrational energy of the boundary acoustic waves between the interface of the second and third media 12 and 13 and the interface of the first and third media 11 and 13.

In the present preferred embodiment, the first medium 11 preferably is made of piezoelectric 15° Y-cut X-propagating LiNbO$_3$ having Euler angles of (0°, 105°, 0°). The second medium 12 preferably is made of non-electroconductive SiN. The third medium 13 preferably is made of SiO$_2$.

The IDT 14 and the reflectors 15 and 16 are preferably made of a metal having a higher density than Al. More specifically, the IDT 14 is made of a metal having a density ρ in the range of about 3000 kg/m³ to about 21500 kg/m³. The IDT 14 preferably has a thickness H1 in the range of approximately 0.006λ≤H1≤0.2λ and the third medium 13 preferably has a thickness H2 in the range of approximately H1<H2≤0.7λ, where λ represents the pitch of electrode fingers of the IDT 14. Thus, the boundary acoustic wave device 10 can exhibit low loss characteristics and can be greatly reduced in size. The boundary acoustic wave device 10 also has a high electromechanical coupling coefficient $K^2$ for boundary acoustic waves and is accordingly not affected by higher-order spurious responses, thus exhibiting superior characteristics. This is further described with reference to specific experiments.

The relationships of the thickness of the electrodes of the boundary acoustic wave device with the acoustic velocity of boundary acoustic waves, the electromechanical coupling coefficient K, the propagation loss αm, and the frequency temperature coefficient TCF were evaluated. For the evaluation, the electrodes were formed of Al, which is conventionally used as the electrode material of the IDT, or Cu, Ag or Au that has a higher density than Al. The results are shown in FIGS. 3 to 18.

For obtaining the results shown in FIGS. 3 to 18 in the SiN/SiO₂/IDT/15° Y-cut X-propagating LiNbO₃ multilayer structure, the thickness of the third medium or the SiO₂ layer was set at about 0.5λ, and the thicknesses of the first and second media were set to be infinite. In FIGS. 3 to 18, U2 shows the results for boundary acoustic waves essentially composed of SH waves, and U3 shows the results for boundary acoustic waves essentially composed of P+SV components.

In the 15° Y-cut X-propagating LiNbO₃ substrate having Euler angles of (0°, 105°, 0°), the coupling of SV+P boundary acoustic waves with the piezoelectric characteristics is weak. Accordingly, the SV+P boundary waves are hardly excited, and SH boundary waves are used as boundary acoustic waves in the main mode.

The results shown in FIGS. 3 to 18 were calculated according to a method disclosed in "A Method for Estimating Optimal Cuts and Propagation Directions for Excitation and Propagation Directions for Excitation of Piezoelectric Surface Waves" (J. J. Campbell and W. R. Jones, IEEE Trans. Sonics and Ultrason., Vol. SU-15 (1968) pp. 209-217).

When the boundaries were open, the acoustic velocity and the propagation loss were obtained, assuming that the displacement, the potential, the normal component of electric flux density, and the vertical stress at the boundary between the second medium 12 and the third medium 13, the boundary between the third medium 13 and the IDT 14, and the boundary between the IDT 14 and the first medium 11 were continuous, that the thicknesses of the second medium 12 and the first medium 11 were infinite, and that the conductor, or the IDT electrode 14, had a relative dielectric constant of 1. When the boundaries were closed, the acoustic velocity and the propagation loss were obtained, assuming that the potentials at the boundary between the third medium 13 and the IDT 14 and the boundary between the IDT 14 and the first medium 11 were 0. The electromechanical coupling coefficient $K^2$ was derived from Equation (1). In Equation (1), Vf represents the acoustic velocity at an open boundary, and V represents the acoustic velocity at a closed boundary.

$$K^2=2\times|Vf-V|/Vf \quad \text{Equation (1)}$$

The frequency temperature coefficient TCF was obtained from the following Equation (2) depending on the phase velocity V at approximately 20° C., 25° C., and 30° C.:

$$TCF=(V[30°\text{ C.}]-V[20°\text{ C.}])/V[25°\text{ C.}]/10°\text{ C.}-\alpha s \quad (2)$$

where, αS represents the linear expansion coefficient of the first medium 11 in the direction in which boundary acoustic waves propagate.

The power flow angle (PFA) at Euler angles [φ, 0, ψ] was derived from the following Equation (3) using the phase velocities V at ψ−0.5°, ψ, and ψ+0.5°:

$$PFA=\tan-1\{V[\psi]\times(V[\psi+0.5°]-V[\psi-0.5°])\} \quad (3)$$

The acoustic velocities of longitudinal waves, fast transverse waves and slow transverse waves in a Y-rotated X-propagating LiNbO₃ are about 6547 m/s, about 4752 m/s and about 4031 m/s, respectively. The acoustic velocities of longitudinal waves and slow transverse waves in the SiO₂ layer are about 5960 m/s and about 3757 m/s, respectively. The acoustic velocities of longitudinal waves and slow transverse waves in the SiN layer are about 10642 m/s and about 5973 m/s, respectively.

FIGS. 3 to 6 and FIGS. 11 to 14 show that in any case using different metal electrodes, the propagation loss αm of SH boundary waves is 0 at a thickness at which the acoustic velocity of SH boundary acoustic waves is less than or equal to the lowest value of about 4031 m/s of the acoustic velocities of longitudinal waves, fast transverse waves and slow transverse waves.

Since Al has a relatively low density ρ, the acoustic velocity of boundary acoustic waves is about 4031 m/s or less. In order to reduce the propagation loss αm to 0, the thickness of Al electrodes must be large. On the other hand, electrodes made of Cu, Ag, or Au, which has a higher density than Al, can lead to a propagation loss αm of 0 by using thinner IDT than the Al IDT. FIGS. 3 to 6 show that as the density of the electrodes is increased, the acoustic velocities of SH boundary waves and P+SV boundary waves can differ more largely from each other in the range of electrode thicknesses at which the propagation loss αm=0 holds. However, when Al electrodes are used, there is no difference.

A lager thickness of the electrodes increases the difference in height between the regions where the electrode fingers of the IDT 14 and reflectors 15 and 16 are present and the regions where the electrode fingers are not present. Accordingly, if the third medium 13 and the second medium 12 are formed by sputtering or evaporation in the portions of medium in which the IDT 14 and reflectors 15 and 16 are arranged, their coverage is not sufficient and the third medium 13 and the second medium 12 may be cracked. In addition, the deposition time is increased, and consequently the cost for forming the third medium 13 and the second medium 12 is liable to increase.

In contrast, Cu, Ag and Au having higher densities than Al can lead to electrodes with a small thickness, and accordingly can solve the above problems. FIGS. 3 to 6 show that there is a condition that the acoustic velocities of SH boundary waves and P+SV boundary waves can differ more largely from each other in the range of electrode thicknesses at which the propagation loss αm=0 holds as the density of the electrodes is increased, and that there is no such condition when Al is used. With the use of SH boundary waves as the main mode, therefore, spurious responses of the P+SV boundary waves acting as unnecessary modes can be reduced by forming the electrodes of a metal having a higher density than Al, and so as to have a thickness in the range of about 0.006λ to about 0.2λ.

As is clear from FIGS. 7 to 10, the use of a conductive material having a relatively high density can produce a higher electromechanical coupling coefficient $K^2$. An IDT 14 made of a conductive material having a high density concentrates the vibrational energy in the vicinity of the IDT 14 because the acoustic velocity in the conductive material is very low. In addition, if the first medium 11 is formed of a piezoelectric material with the IDT 14 in contact with the piezoelectric material, the energy in the piezoelectric material is increased and thus the electromechanical coupling coefficient $K^2$ is further increased.

A design technique for adjusting the electromechanical coupling coefficient $K^2$ with propagation angle has been known. If the electromechanical coupling coefficient $K^2$ is increased, the range of its adjustment expands. Accordingly, the range of design can be further increased.

Pt electrodes resulted in substantially the same effect as the Au electrodes. Since Pt has a slightly higher density than Au, the vibrational energy tended to concentrate more in the vicinity of the IDT 14.

Figure 49:
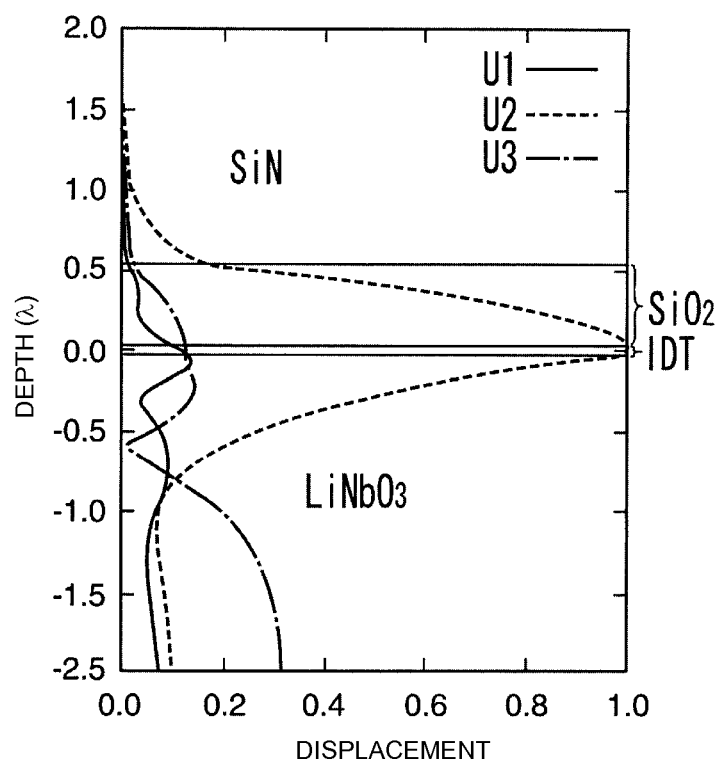
FIG. 49 is a representation of the displacement distribution of SH boundary acoustic waves and P and SV wave components in a structure of SiN/SiO$_2$/IDT/15° Y-cut X-propagating LiNbO$_3$ substrate including an approximately 0.05λ thick Al IDT and an approximately 0.5λ thick SiO$_2$ layer.
Figure 50:
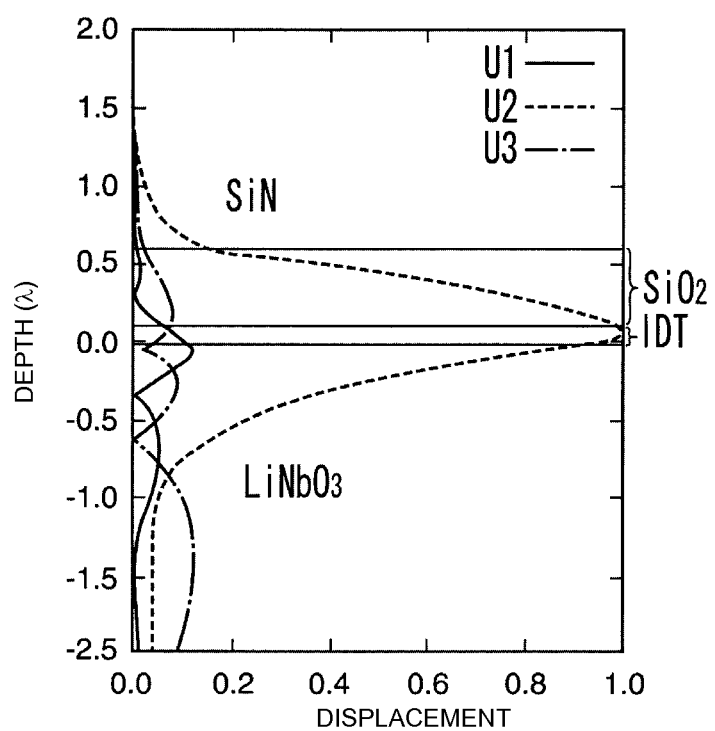
FIG. 50 is a representation of the displacement distribution of SH boundary acoustic waves and P and SV wave components in a structure of SiN/SiO$_2$/IDT/15° Y-cut X-propagating LiNbO$_3$ substrate including an approximately 0.10λ thick Al IDT and an approximately 0.5λ thick SiO$_2$ layer.
Figure 51:
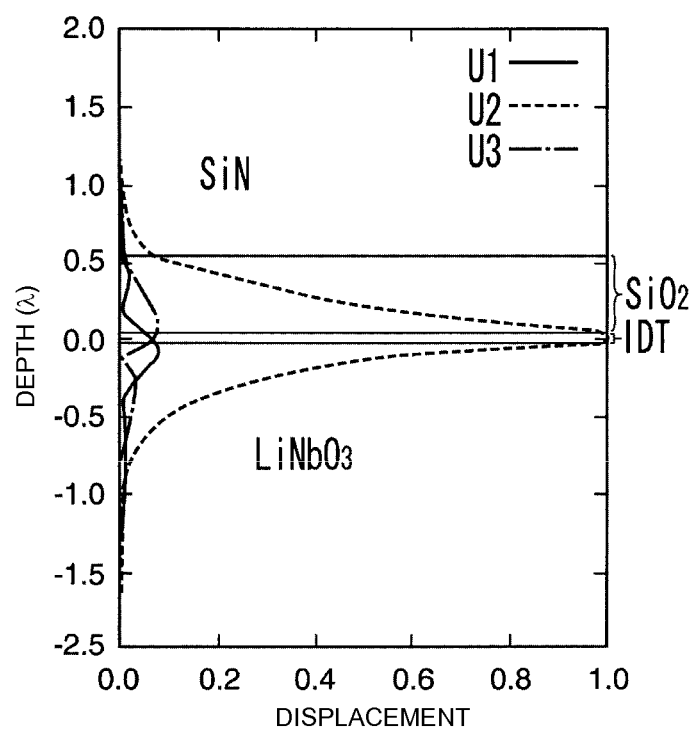
FIG. 51 is a representation of the displacement distribution of SH boundary acoustic waves and P and SV wave components in a structure of SiN/SiO$_2$/IDT/15° Y-cut X-propagating LiNbO$_3$ substrate including an approximately 0.05λ thick Au IDT and an approximately 0.5λ thick SiO$_2$ layer.

FIGS. 49 to 51 show displacement distributions of SH boundary acoustic waves generated with the use of an IDT 14 defined by an approximately 0.05λ thick Al layer, an approximately 0.10λ thick Al layer, or an approximately 0.05λ thick Au layer. With the use of the approximately 0.05λ thick Al IDT 14, the vibrational energy escapes and is transmitted to the LiNbO$_3$ side or first medium side as is clear from FIG. 49, and hence boundary acoustic waves are not sufficiently trapped in the boundaries between the media. With the use of the approximately 0.10λ thick Al IDT 14, the vibrational energy is prevented from escaping, but is distributed in the LiNbO$_3$ layer of the first medium 11 up to a depth of about 5λ or more (not shown in the figure) and in the SiN layer of the second medium up to a depth of about 1.2λ, as is clear from FIG. 50. Thus, the results suggest that the thicknesses of the first and second media must be large.

On the other hand, with the use of the approximately 0.05λ thick Au IDT 14 as shown in FIG. 51, the vibrational energy is distributed only in the region of the LiNbO$_3$ layer up to a depth of about 0.9λ and the region of the SiN layer up to a depth of about 0.9λ even though the IDT thickness is as small as about 0.05λ. Hence, the vibrational energy of boundary waves can be efficiently trapped. The use of an IDT 14 made of Au having a higher density ρ than Al allows the reduction of the thicknesses of both the SiN second medium and the LiNbO$_3$ first medium. Consequently, the resulting boundary acoustic wave device can be thin and its manufacturing cost can be reduced.

SiO$_2$ has a density of about 2210 kg/m$^3$, and an acoustic characteristic impedance of about 8.3×106 kg·s/m$^2$ for transverse waves; Al has a density of about 2699 kg/m$^3$, and an acoustic characteristic impedance of about 8.4×106 kg·s/m$^2$ for transverse waves; Cu has a density of about 8939 kg/m$^3$, and an acoustic characteristic impedance of about 21.4×106 kg·s/m$^2$ for transverse waves; Ag has a density of about 10500 kg/m$^3$, and an acoustic characteristic impedance of about 18.6×106 kg·s/m$^2$ for transverse waves; Au has a density of about 19300 kg/m$^3$, and an acoustic characteristic impedance of about 24.0×106 kg·s/m$^2$ for transverse waves.

Since the differences in density and acoustic characteristic impedance between SiO$_2$ and Al are small, the strips have a low reflection coefficient in the structure including a SiO$_2$ third medium 13 and an Al IDT 14. Accordingly, a large number of strips are required in order to ensure a sufficient reflection coefficient of the reflectors 15 and 16. This disadvantageously increases the size of the device. If the reflection of the strips of the IDT 14 is reduced, the shape factor of a longitudinally coupled resonator-type boundary acoustic wave filter or the directivity of the EWC SPUDT of a transversal boundary acoustic wave filter is disadvantageously degraded.

In contrast, the difference in density and acoustic characteristic impedance between SiO$_2$ and Au are sufficiently large. Accordingly, the strips of the IDT 14 have a sufficiently high reflection coefficient in the structure including a SiO$_2$ third medium 13 and an Au IDT 14. The reflectors 15 and 16 also have a sufficiently high reflection coefficient even if the number of strips is small. Consequently, a longitudinally coupled resonator-type filter having a superior shape factor, or a SPUDT having a high directivity can be achieved.

In the boundary acoustic wave device 10 of the above-described preferred embodiment, the third medium 13 has a certain thickness, and the interface between the second medium 12 and the third medium 13 and the interface between the third medium 13 and the first medium 11 are formed on and under the third medium 13. If the thickness of the third medium 13 is increased, a higher-order mode occurs in which waves propagate and are trapped between those interfaces.

As described above, in the LiNbO$_3$ substrate having Euler angles (0°, 105°, 0°), SV+P boundary waves are hardly excited and SH boundary waves act as the main mode. Also, an SH component-based higher-order mode is strongly excited to cause spurious response. It is accordingly important to reduce such an SH-type higher-order mode. In a boundary acoustic wave device having the multilayer structure including the three media 11 to 13, higher-order waves propagating while also being trapped between the interfaces on and under the third medium 13 can be cut off to reduce the higher-order waves by reducing the thickness of the third medium 13.

Figure 19:
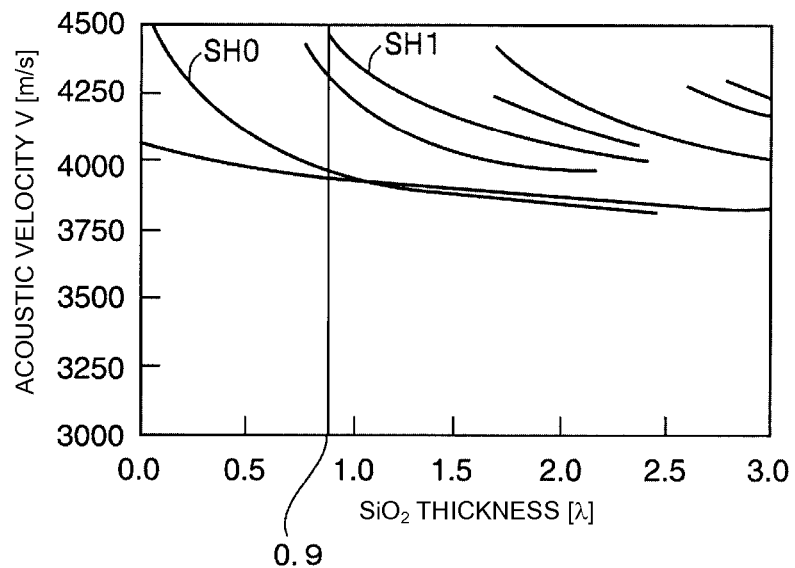
FIG. 19 is a representation of the relationship between the thickness of the SiO$_2$ layer and the primary mode (SH0) and higher-order modes of SH boundary acoustic waves in a SiN/SiO$_2$/IDT/LiNbO$_3$ multilayer structure in which the IDT is made of Al.
Figure 20:
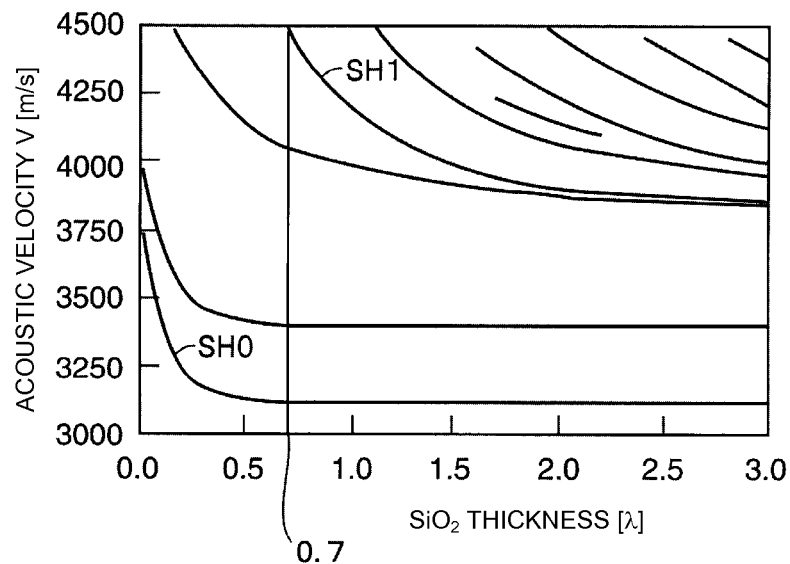
FIG. 20 is a representation of the relationship between the thickness of the SiO$_2$ layer and the primary mode and higher-order modes of SH boundary acoustic waves in a SiN/SiO$_2$/IDT/LiNbO$_3$ multilayer structure in which the IDT is made of Au.
Figure 21:
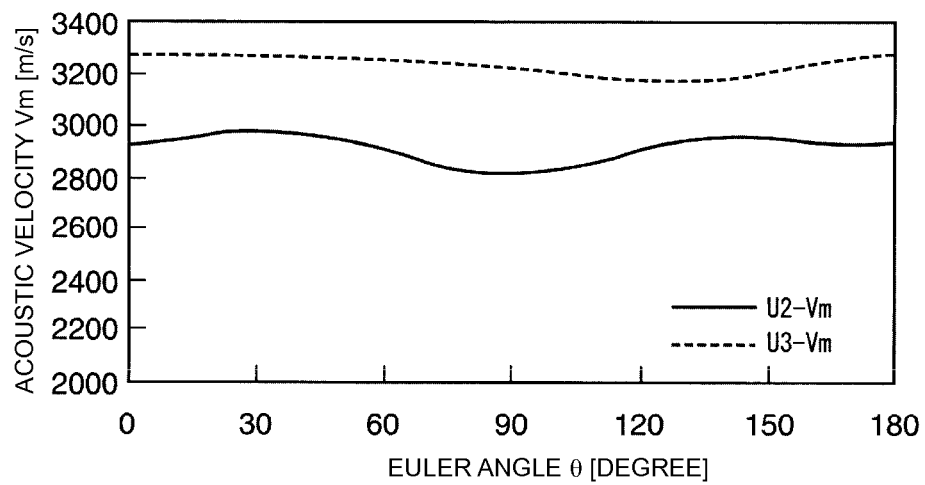
FIG. 21 is a representation of the relationship between an Euler angle $\theta$ of the LiNbO$_3$ layer and the acoustic velocity Vm (m/s) of boundary acoustic waves in a SiN/SiO$_2$/IDT/LiNbO$_3$ multilayer structure.
Figure 22:
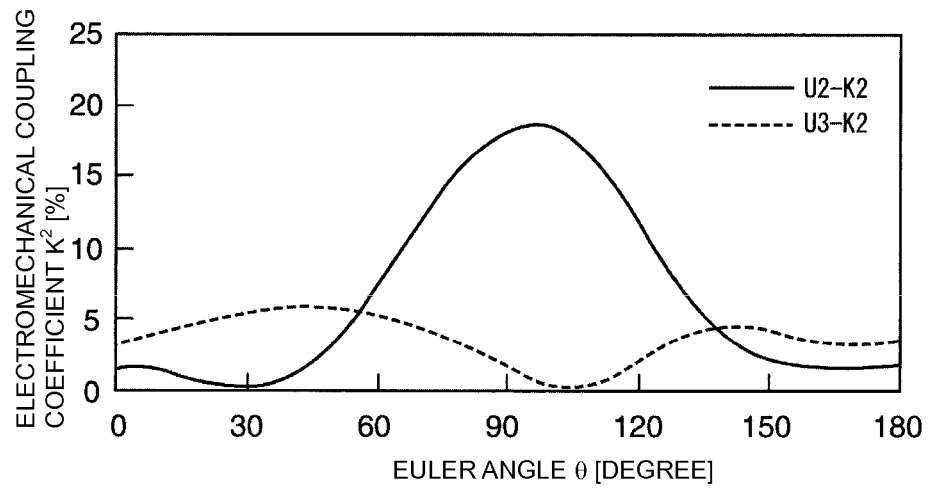
FIG. 22 is a representation of the relationship between an Euler angle $\theta$ of the LiNbO$_3$ layer and the electromechanical coupling coefficient $K^2$ (%) for boundary acoustic waves in a SiN/SiO$_2$/IDT/LiNbO$_3$ multilayer structure.
Figure 23:
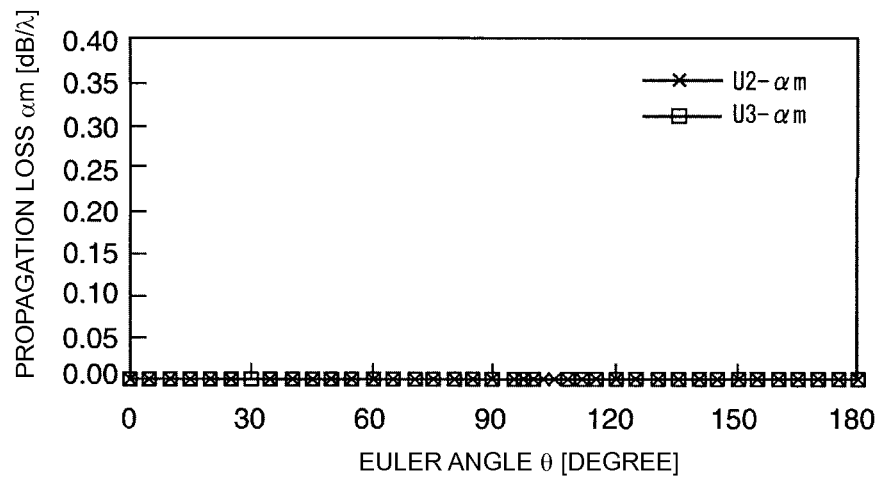
FIG. 23 is a representation of the relationship between an Euler angle $\theta$ of the LiNbO$_3$ layer and the propagation loss $\alpha$m (dB/$\lambda$) of boundary acoustic waves in a SiN/SiO$_2$/IDT/LiNbO$_3$ multilayer structure.
Figure 24:
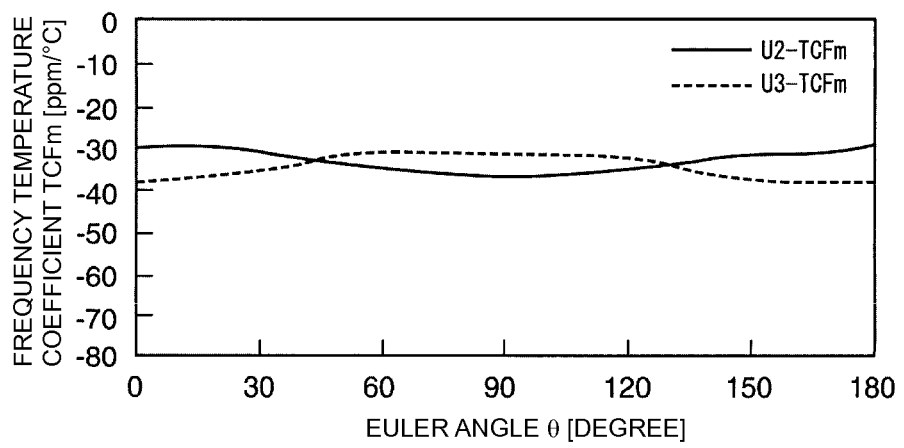
FIG. 24 is a representation of the relationship between an Euler angle $\theta$ of the LiNbO$_3$ layer and the frequency temperature coefficient TCFm (ppm/° C.) for boundary acoustic waves in a SiN/SiO$_2$/IDT/LiNbO$_3$ multilayer structure.
Figure 25:
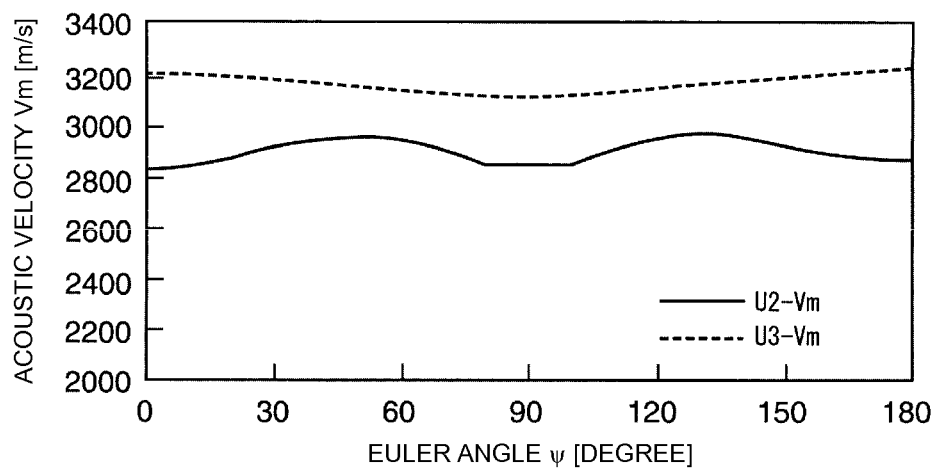
FIG. 25 is a representation of the relationship between an Euler angle $\psi$ of the LiNbO$_3$ layer and the acoustic velocity Vm (m/s) of boundary acoustic waves in a SiN/SiO$_2$/IDT/LiNbO$_3$ multilayer structure.
Figure 26:
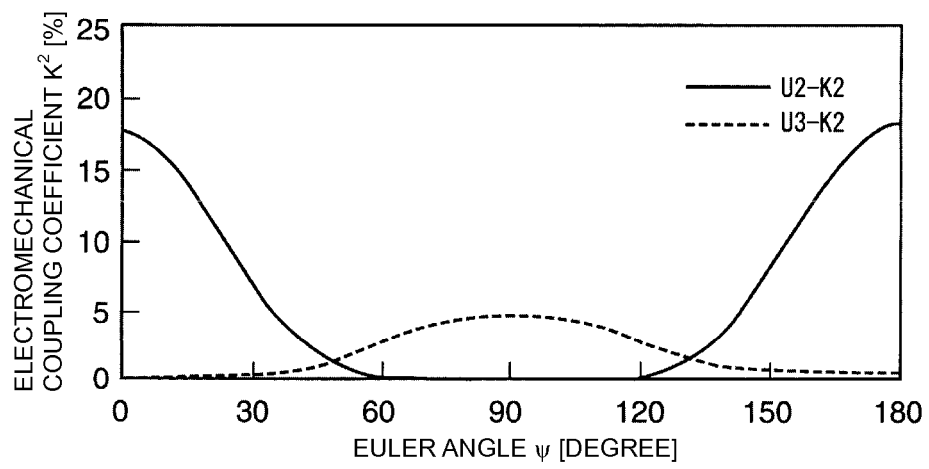
FIG. 26 is a representation of the relationship between an Euler angle $\psi$ of the LiNbO$_3$ layer and the electromechanical coupling coefficient $K^2$ (%) for boundary acoustic waves in a SiN/SiO$_2$/IDT/LiNbO$_3$ multilayer structure.
Figure 27:
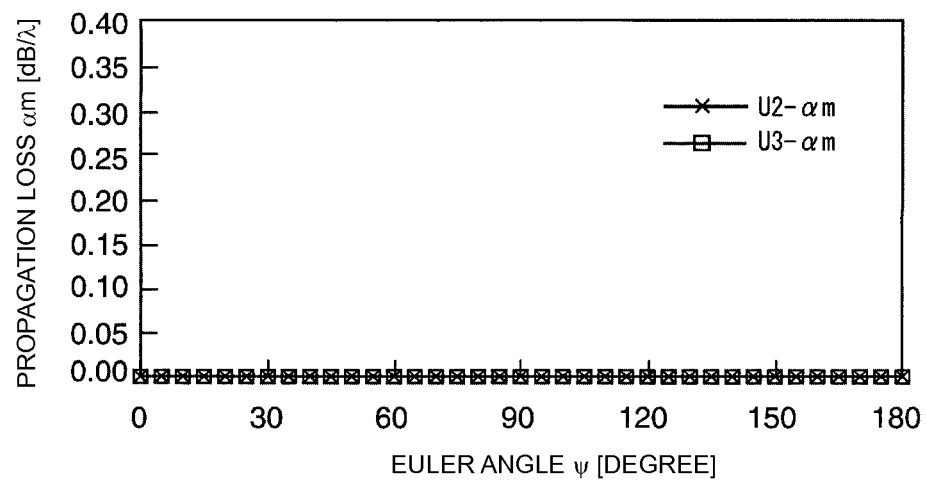
FIG. 27 is a representation of the relationship between an Euler angle ψ of the LiNbO$_3$ layer and the propagation loss αm (dB/λ) of boundary acoustic waves in a SiN/SiO$_2$/IDT/LiNbO$_3$ multilayer structure.
Figure 28:
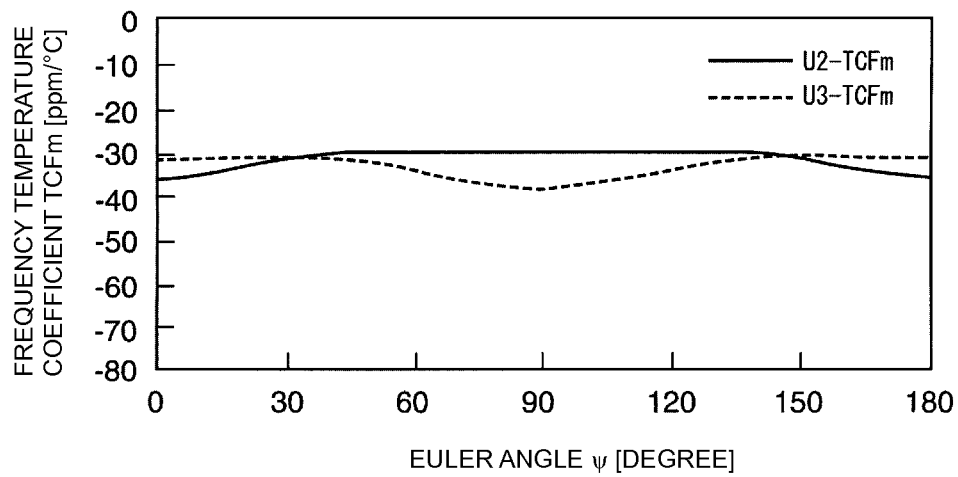
FIG. 28 is a representation of the relationship between an Euler angle ψ of the LiNbO$_3$ layer and the frequency temperature coefficient TCFm (ppm/° C.) for boundary acoustic waves in a SiN/SiO$_2$/IDT/LiNbO$_3$ multilayer structure.
Figure 29:
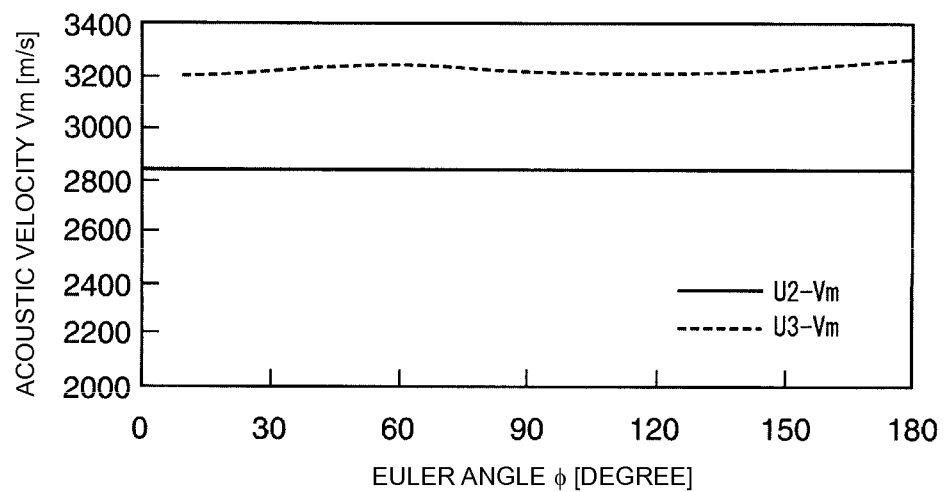
FIG. 29 is a representation of the relationship between an Euler angle φ of the LiNbO$_3$ layer and the acoustic velocity Vm (m/s) of boundary acoustic waves in a SiN/SiO$_2$/IDT/LiNbO$_3$ multilayer structure.
Figure 30:
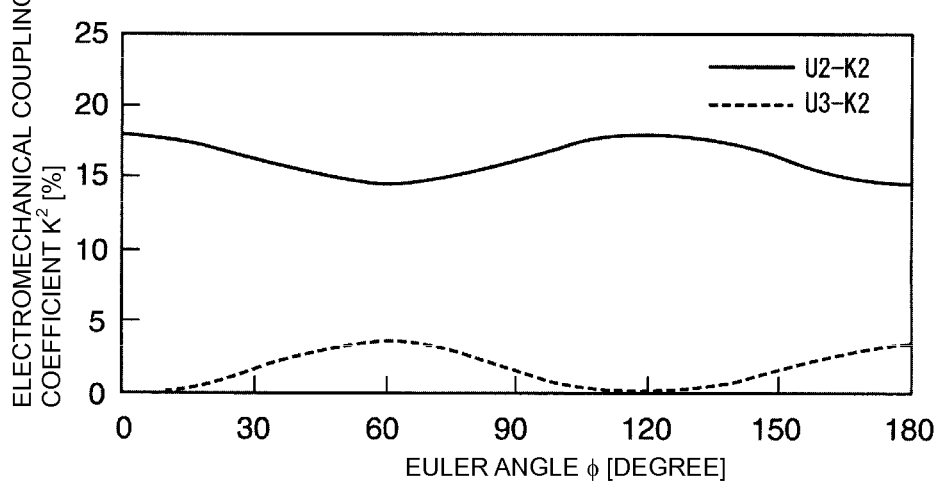
FIG. 30 is a representation of the relationship between an Euler angle φ of the LiNbO$_3$ layer and the electromechanical coupling coefficient K$^2$ (%) for boundary acoustic waves in a SiN/SiO$_2$/IDT/LiNbO$_3$ multilayer structure.
Figure 31:
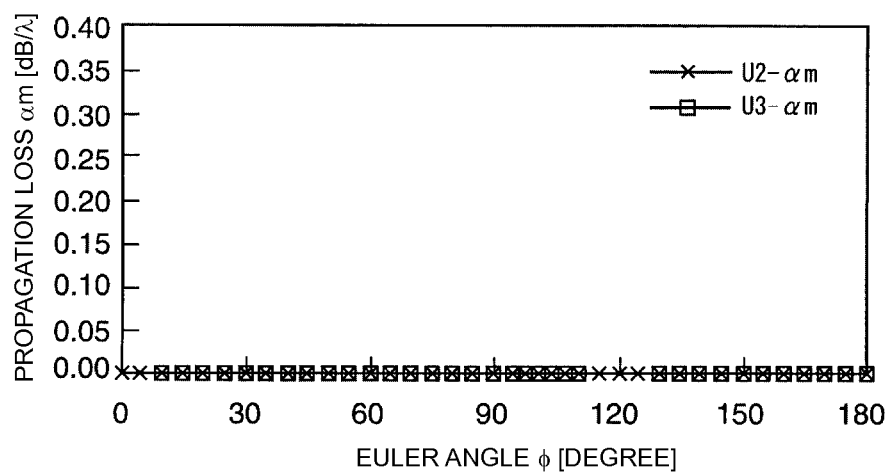
FIG. 31 is a representation of the relationship between an Euler angle φ of the LiNbO$_3$ layer and the propagation loss αm (dB/λ) of boundary acoustic waves in a SiN/SiO$_2$/IDT/LiNbO$_3$ multilayer structure.
Figure 32:
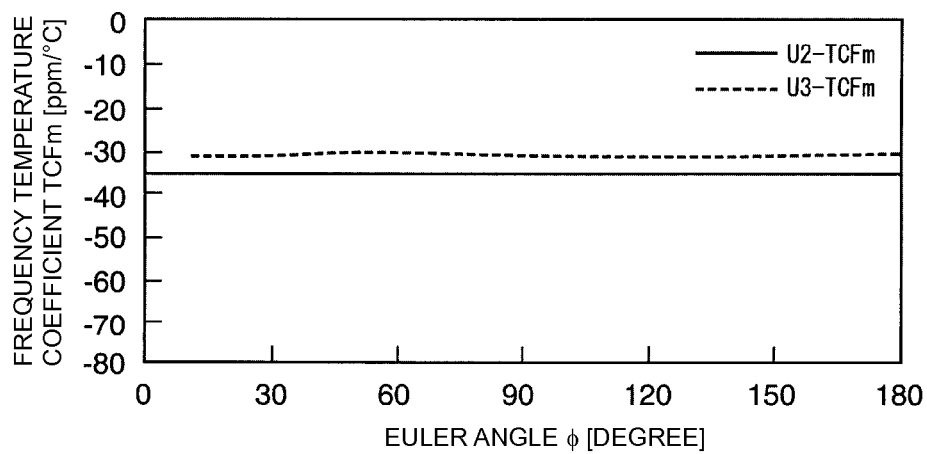
FIG. 32 is a representation of the relationship between an Euler angle φ of the LiNbO$_3$ layer and the frequency temperature coefficient TCFm (ppm/° C.) for boundary acoustic waves in a SiN/SiO$_2$/IDT/LiNbO$_3$ multilayer structure.
Figure 33:
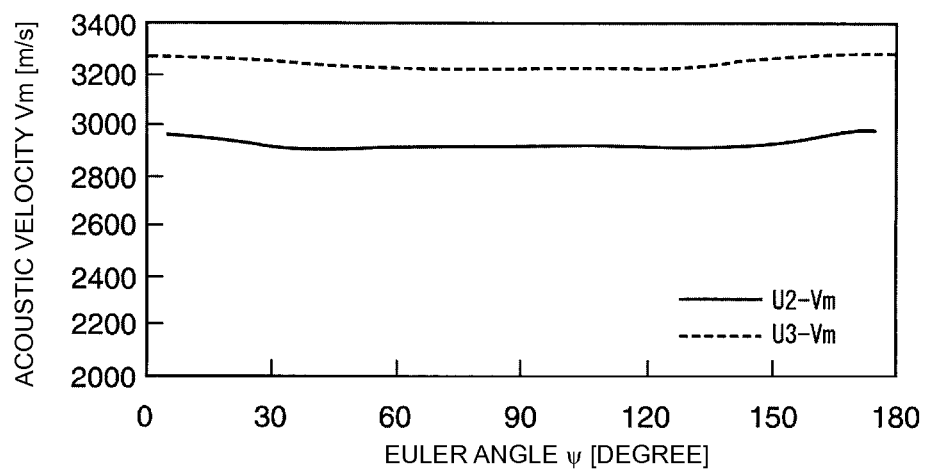
FIG. 33 is a representation of the relationship between ψ and the acoustic velocity Vm (m/s) of boundary acoustic waves in a SiN/SiO$_2$/IDT/LiNbO$_3$ multilayer structure in which the IDT is made of Au and the LiNbO$_3$ substrate has Euler angles of (0°, 30°, ψ).
Figure 34:
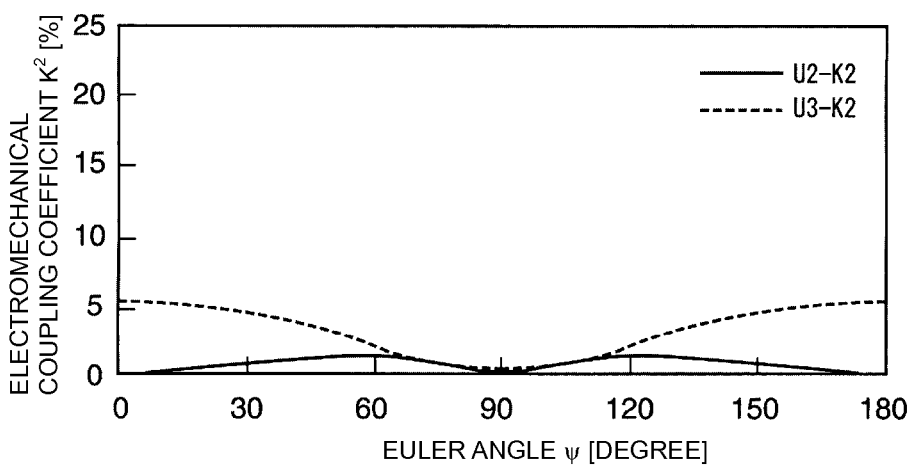
FIG. 34 is a representation of the relationship between ψ and the electromechanical coupling coefficient K$^2$ (%) for boundary acoustic waves in a SiN/SiO$_2$/IDT/LiNbO$_3$ multilayer structure in which the IDT is made of Au and the LiNbO$_3$ substrate has Euler angles of (0°, 30°, ψ).
Figure 35:
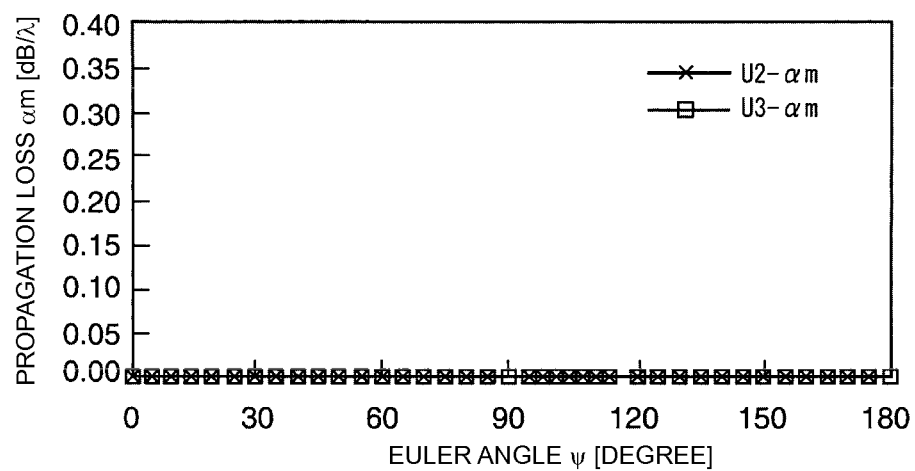
FIG. 35 is a representation of the relationship between ψ and the propagation loss αm (dB/λ) of boundary acoustic waves in a SiN/SiO$_2$/IDT/LiNbO$_3$ multilayer structure in which the IDT is made of Au and the LiNbO$_3$ substrate has Euler angles of (0°, 30°, ψ).
Figure 36:
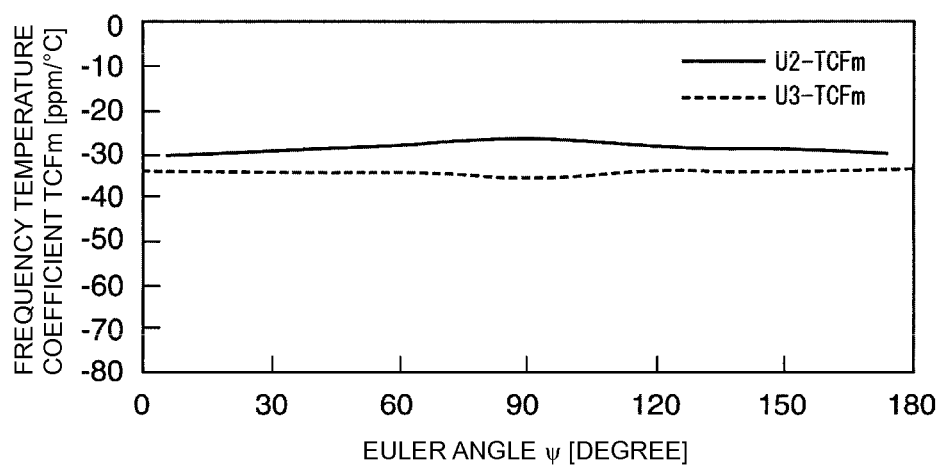
FIG. 36 is a representation of the relationship between ψ and the frequency temperature coefficient TCFm (ppm/° C.) for boundary acoustic waves in a SiN/SiO$_2$/IDT/LiNbO$_3$ multilayer structure in which the IDT is made of Au and the LiNbO$_3$ substrate has Euler angles of (0°, 30°, ψ).
Figure 37:
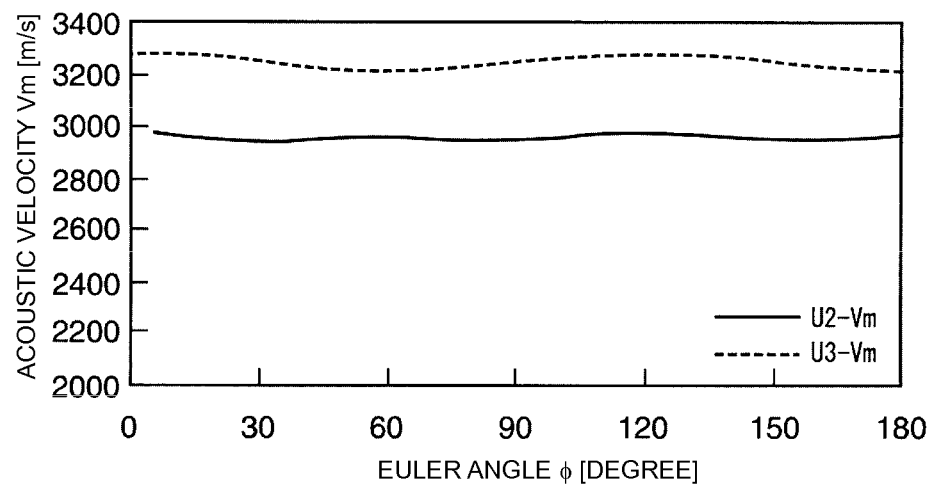
FIG. 37 is a representation of the relationship between φ and the acoustic velocity Vm (m/s) of boundary acoustic waves in a SiN/SiO$_2$/IDT/LiNbO$_3$ multilayer structure in which the IDT is made of Au and the LiNbO$_3$ substrate has Euler angles of (φ, 30°, 0°).
Figure 38:
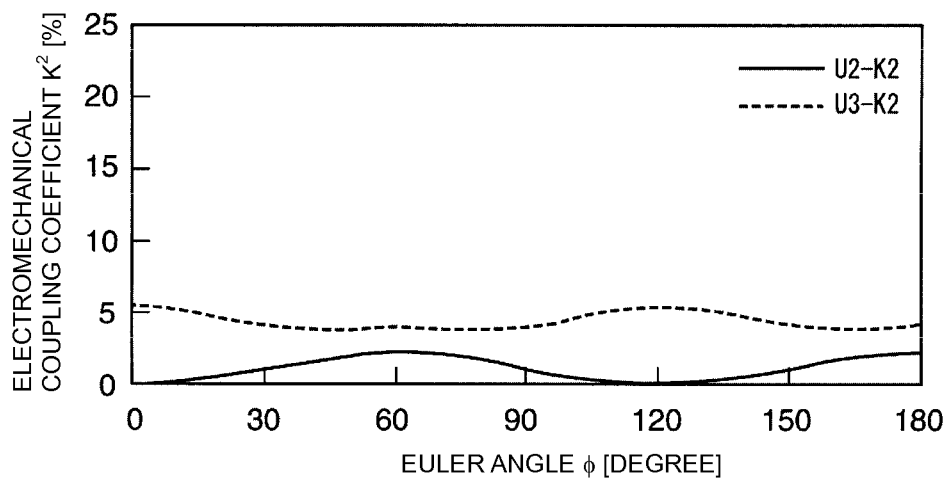
FIG. 38 is a representation of the relationship between φ and the electromechanical coupling coefficient K$^2$ (%) for boundary acoustic waves in a SiN/SiO$_2$/IDT/LiNbO$_3$ multilayer structure in which the IDT is made of Au and the LiNbO$_3$ substrate has Euler angles of (φ, 30°, 0°).
Figure 39:
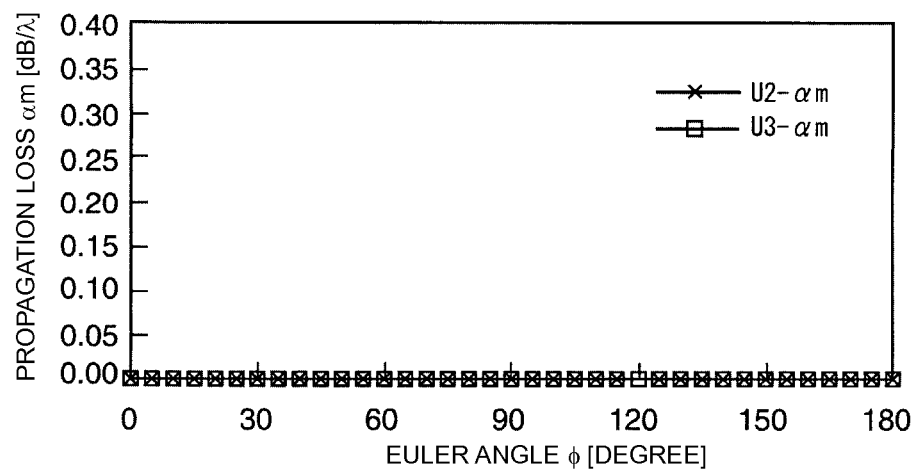
FIG. 39 is a representation of the relationship between φ and the propagation loss αm (dB/λ) of boundary acoustic waves in a SiN/SiO$_2$/IDT/LiNbO$_3$ multilayer structure in which the IDT is made of Au and the LiNbO$_3$ substrate has Euler angles of (φ, 30°, 0°).
Figure 40:
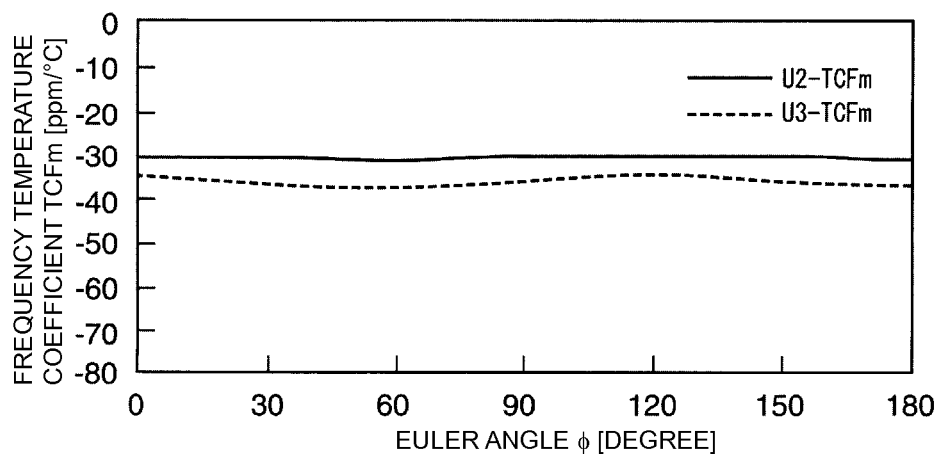
FIG. 40 is a representation of the relationship between φ and the frequency temperature coefficient TCFm (ppm/° C.) for boundary acoustic waves in a SiN/SiO$_2$/IDT/LiNbO$_3$ multilayer structure in which the IDT is made of Au and the LiNbO$_3$ substrate has Euler angles of (φ, 30°, 0°).
Figure 41:
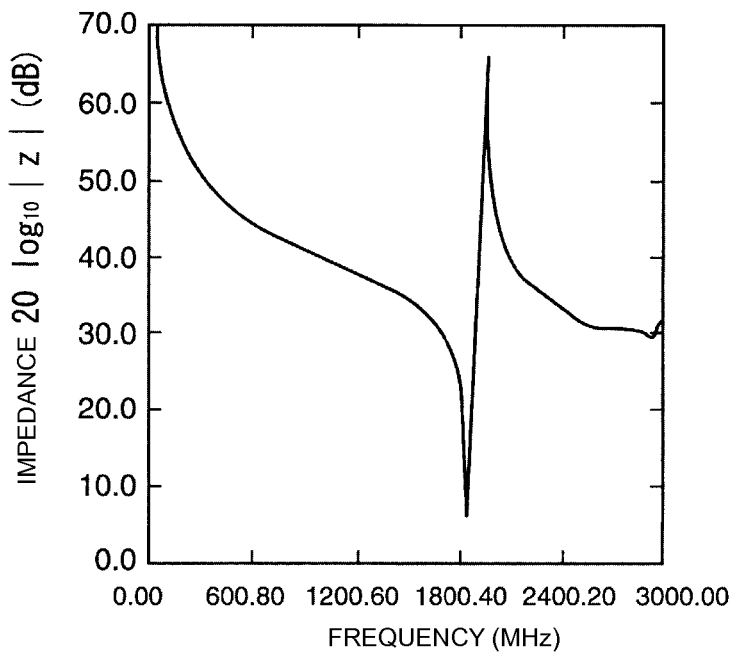
FIG. 41 is a representation of the resonance characteristic of a boundary acoustic wave resonator having a thickness ratio of about 3000 nm/500 nm according to a preferred embodiment of the present invention.
Figure 42:
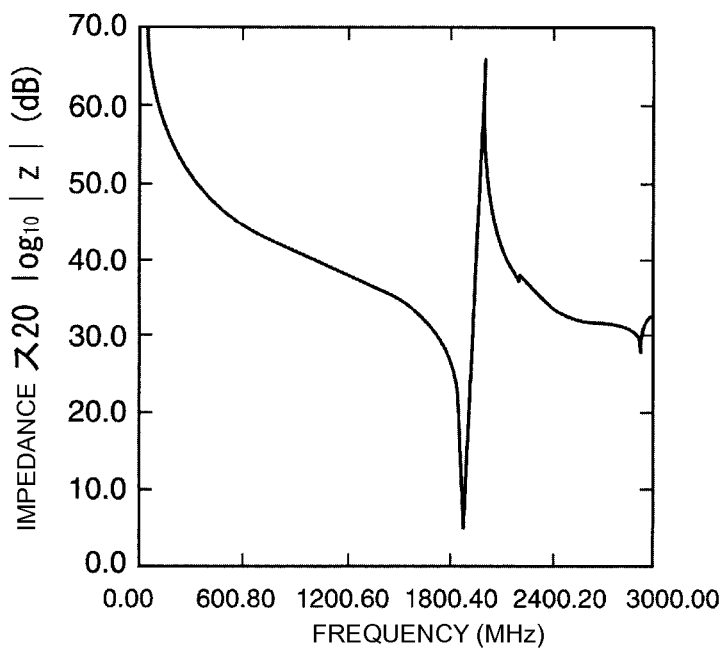
FIG. 42 is a representation of the resonance characteristic of a boundary acoustic wave resonator having a thickness ratio of about 3000 nm/200 nm according to a preferred embodiment of the present invention.
Figure 43:
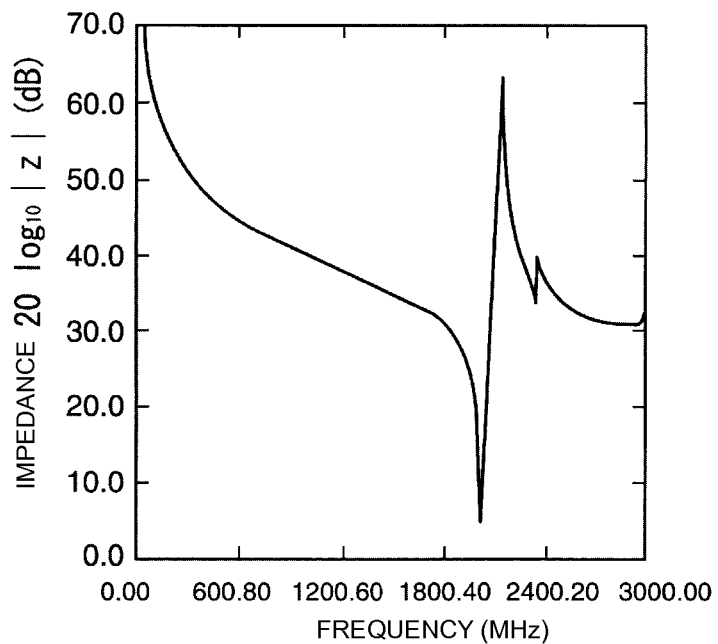
FIG. 43 is a representation of the resonance characteristic of a boundary acoustic wave resonator having a thickness ratio of about 3000 nm/100 nm according to a preferred embodiment of the present invention.
Figure 44:
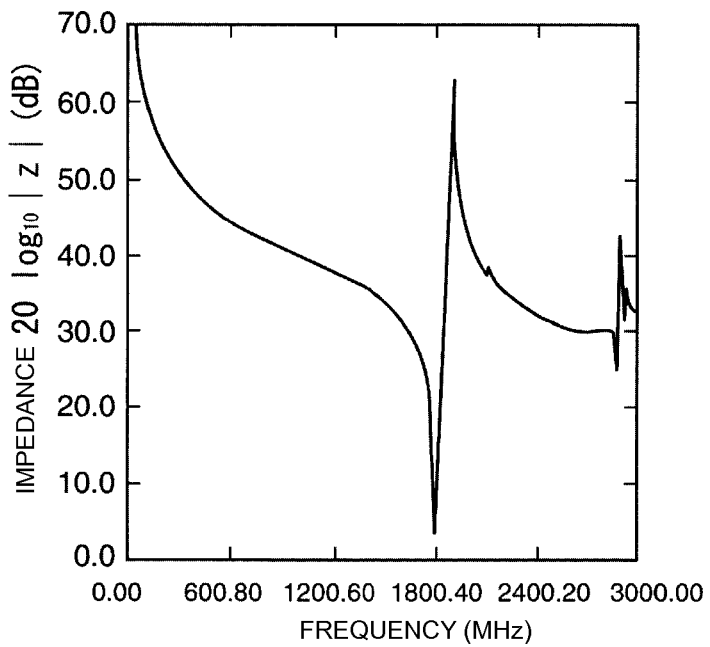
FIG. 44 is a representation of the resonance characteristic of a boundary acoustic wave resonator having a thickness ratio of PSi/SiO$_2$=3000 nm/500 nm according to a preferred embodiment of the present invention.
Figure 45:
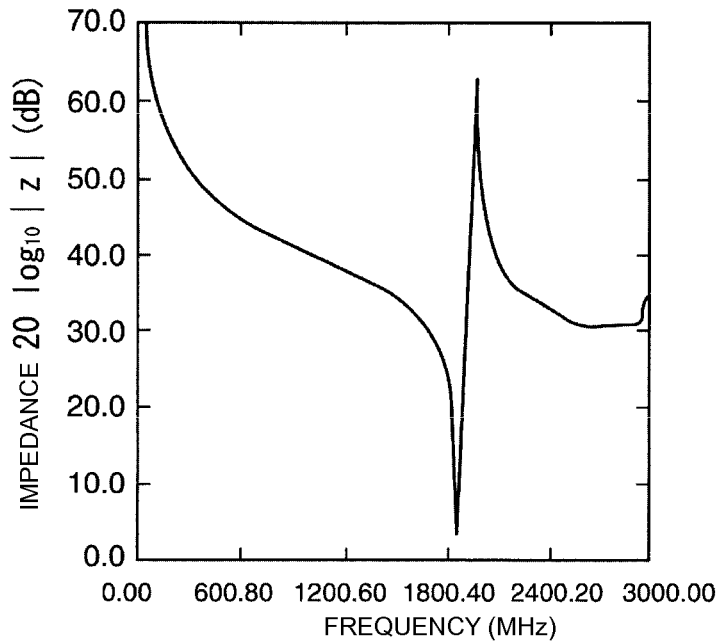
FIG. 45 is a representation of the resonance characteristic of a boundary acoustic wave resonator having a thickness ratio of PSi/SiO$_2$=3000 nm/200 nm according to a preferred embodiment of the present invention.
Figure 46:
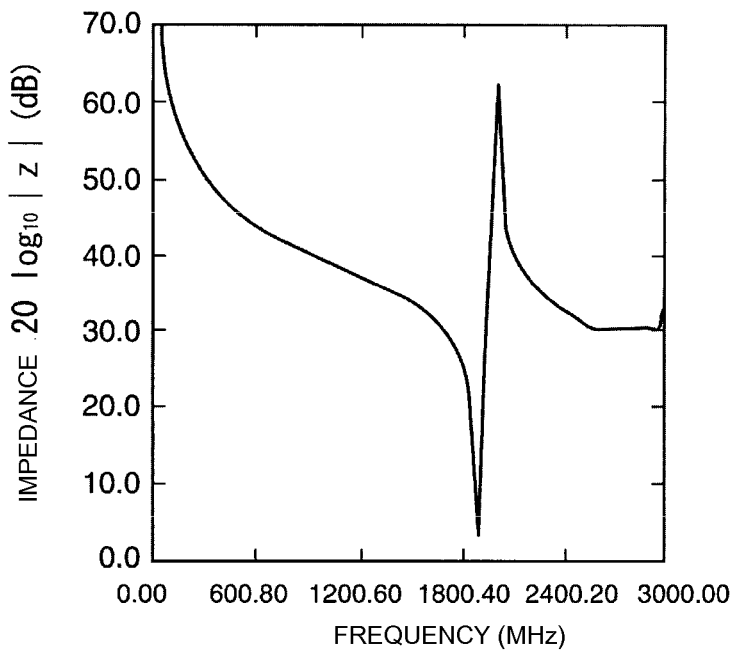
FIG. 46 is a representation of the resonance characteristic of a boundary acoustic wave resonator having a thickness ratio of PSi/SiO$_2$=3000 nm/100 nm according to a preferred embodiment of the present invention.

FIGS. 19 and 20 are each a representation of the relationship between higher order modes and the thickness of the SiO$_2$ layer of a SiN/SiO$_2$/IDT/LiNbO$_3$ multilayer structure including an Al IDT or Au IDT. In the multilayer structure, the LiNbO$_3$ layer had Euler angles of (0°, 105°, 0°) and the IDT had a thickness of about 0.05λ.

FIG. 19 clearly shows that when the SiO$_2$ layer has a thickness of about 0.9λ or less in the structure having the Al IDT, higher order SH boundary wave spurious responses are cut off. On the other hand, when the SiO$_2$ layer has a thickness of about 0.7λ or less in the structure having the Au IDT, higher-order SH boundary waves can be cut off, as shown in FIG. 20. Thus, the use of high-density Au electrodes allows the thickness of the SiO$_2$ layer or third medium 13, which can cut off higher mode waves, to be reduced. Accordingly, the boundary acoustic wave device can be greatly reduced in size.

This is because with the use of a high-density conductive material, the vibrational energy is easily concentrated in the vicinities of the third medium 13 and the IDT 14 to produce higher order modes, and it is also because it is accordingly desirable that the thickness of the third medium 13 be reduced. FIG. 20 clearly shows that a third medium 13 with a smaller thickness allows the acoustic velocity of the main-mode waves SH0 to differ largely from that of higher-order waves designated by, for example, SH1. Thus, the difference in frequency between the main mode and higher modes can advantageously be increased.

With the use of an IDT 14 made of Au or a metal having a higher density than Al, higher order modes can be cut off by setting the thickness of the third medium 13 to about 0.7λ or less, as is clear from FIG. 20. Furthermore, in order to adapt to variations in manufacture or in order to cut off higher order modes from a wide range of frequency bands, the third medium 13 preferably has a thickness of about 0.5λ or less.

The case in which SH boundary waves are in the main mode has been described above. If P+SV boundary waves are in the main mode, P+SV higher order modes are strongly excited. Accordingly, the P+SV higher-order modes must be reduced. The P+SV higher order modes can be reduced by reducing the thickness of the third medium 13, as in the case of the higher order SH boundary waves. In addition, the difference in response frequency between higher order modes and the main mode can be increased.

With the use of P+SV boundary waves, the difference in response frequency between the main mode and higher order modes can be sufficiently increased by reducing the thickness of the third medium 13 to about 0.7λ or less, preferably to about 0.5λ or less.

Main mode P+SV boundary waves can be easily produced by using, for example, a 120° Y-cut X-propagating LiNbO$_3$ substrate having Euler angles of (0°, 30°, 0°).

FIGS. 21 to 24 show the relationships of θ of the Euler angles (0°, θ, 0°) of the LiNbO$_3$ first medium 11 with the acoustic velocity of boundary acoustic waves, the electromechanical coupling coefficient $K^2$, the propagation loss, and the frequency temperature coefficient TCF, respectively. In FIGS. 21 to 24, U2 shows the results for boundary waves essentially composed of SH components, and U3 shows the results for boundary waves essentially composed of P+SV components. The results were obtained under the following conditions.

Multilayer structure was SiN/SiO$_2$/IDT/LiNbO$_3$, where the LiNbO$_3$ is the first medium 11; the SiN is the second medium 12; and the SiO$_2$ is the third medium 13.

The thickness of the SiN second medium 12 was infinite, the thickness of the first medium 11 was infinite, the thickness of the SiO$_2$ third medium 13 was about 0.5λ; and the IDT 14 was formed of Au to a thickness of about 0.07λ.

As is clear from FIGS. 21 to 24, when an Euler angle θ is about 114°, the spurious responses of P+SV boundary waves are reduced and the electromechanical coupling coefficient $K^2$ for SH boundary waves is increased.

More specifically, when the Euler angle θ is preferably in the range of 92°>θ>114°, the electromechanical coupling coefficient $K^2$ for P+SV boundary waves is reduced to about 1% or less; and more preferably when the Euler angle θ is in the range of approximately 96°>θ>111°, the electromechanical coupling coefficient $K^2$ for P+SV boundary waves is reduced to about 0.5% or more. Still more preferably, when 100°>θ>108° is satisfied, the electromechanical coupling coefficient $K^2$ for P+SV boundary waves is reduced to about 0.1% or less; and further, when θ=104° is satisfied, the electromechanical coupling coefficient $K_2$ for P+SV boundary waves becomes 0 or an optimum value, and the electromechanical coupling coefficient $K_2$ for SH boundary waves is increased to about 14%.

FIGS. 25 to 28 are representations of the relationships of ψ of the Euler angles (00, 104°, ψ) with the acoustic velocity of boundary acoustic waves, the electromechanical coupling coefficient $K^2$, the propagation loss, and the frequency temperature coefficient TCF, respectively, obtained in the same manner as FIGS. 21 to 24.

The Euler angle ψ represents the direction in which boundary acoustic waves propagate on the substrate.

As is clear from FIGS. 25 to 28, the electromechanical coupling coefficient for SH boundary waves can be adjusted in the range of about 0.1% to about 17.8% by setting the Euler angle ψ in the range of about 0° to about 60°. In this vicinity, the electromechanical coupling coefficient $K^2$ for P+SV boundary waves, which cause spurious responses, is as small as about 0% at ψ=0°, 0.4% at ψ=30°, 0.7% at ψ=40°, and 1.4% at ψ=50°.

If ψ is larger than about 60°, the electromechanical coupling coefficient $K^2$ for P+SV waves becomes about 2.6% or more and the electromechanical coupling coefficient $K^2$ for SH boundary waves becomes as small as about 0.1% or less. Thus, P+SV boundary waves can be used as the main mode.

FIGS. 29 to 32 are representations of the relationships of φ of the Euler angles (φ, 104°, 0°) with the acoustic velocity of boundary acoustic waves, the electromechanical coupling coefficient $K^2$, the propagation loss, and the frequency temperature coefficient TCF, respectively, obtained in the same manner as FIGS. 21 to 24.

FIGS. 29 to 32 and crystalline symmetry show that when the Euler angle is in the ranges of approximately −25°>φ>25° and 95°>φ>145°, the electromechanical coupling coefficient $K^2$ for P+SV boundary waves is advantageously reduced to about 1% or less; and when the Euler angle φ is in the ranges of approximately −19°>φ>19° and approximately 101°>φ>139°, the electromechanical coupling coefficient $K^2$ for P+SV boundary waves is more advantageously reduced to about 0.5% or less. Still more advantageously, when φ is in the ranges of approximately −8°>φ>8° and approximately 112°>φ>128°, the electromechanical coupling coefficient $K^2$ for P+SV boundary waves is reduced to about 0.1% or less; and further, when the Euler angle is φ=0° or φ=120°, the electromechanical coupling coefficient $K^2$ for P+SV boundary waves becomes about 0% or an optimum value, and the electromechanical coupling coefficient $K^2$ for SH boundary waves is increased to about 16.7% or more.

FIGS. 21 to 24 also show that in the vicinity of θ=30°, spurious responses of SH boundary waves are reduced and the electromechanical coupling coefficient $K^2$ for P+SV boundary waves is increased.

It is shown that the electromechanical coupling coefficient $K^2$ for SH boundary waves is reduced to about 1% or less at an Euler angle θ in the range of approximately 15°>θ>41° and is more advantageously reduced to about 0.5% or less at an Euler angle θ in the range of approximately 21°>θ>38°.

It is further shown that the electromechanical coupling coefficient $K^2$ for SH boundary waves is still more advantageously reduced to about 0.1% or less in the range of approximately 26°>θ>34°, and that when the Euler angle is θ=30°, the electromechanical coupling coefficient $K^2$ for SH boundary waves becomes about 0% or an optimum value, and the electromechanical coupling coefficient $K^2$ of P+SV boundary waves is increase to about 4% or more.

FIGS. 33 to 36 are representations of the relationships of ψ of the Euler angles (0°, 30°, ψ) with the acoustic velocity of boundary acoustic waves, $K^2$, the propagation loss, and the frequency temperature coefficient TCF, respectively, obtained in the same manner as FIGS. 21 to 24, FIGS. 33 to 36 and crystalline symmetry show that when the Euler angle ψ is in the range of approximately −35°>ψ>35°, the electromechanical coupling coefficient $K^2$ for SH boundary waves is reduced to about 1% or less; and when approximately −20°>ψ>20° satisfied, the electromechanical coupling coefficient $K^2$ for SH boundary waves is advantageously reduced to about 0.5% or less. Still more advantageously, the electromechanical coupling coefficient $K^2$ for SH boundary waves is reduced to about 0.1% or less in the range of approximately −8°>ψ>8°. Furthermore, when the Euler angle is ψ=0°, the electromechanical coupling coefficient $K^2$ for SH boundary waves becomes about 0% or an optimum value, and the electromechanical coupling coefficient $K^2$ of P+SV boundary waves is increased to about 4.4% or more.

With the use of P+SV boundary waves in the vicinity of the Euler angles (0°, 30°, 0°), a propagation angle ψ of about 35° or more leads to an increased electromechanical coupling coefficient $K^2$ for SH boundary waves, consequently causing spurious responses. However, if the spurious responses are acceptable in view of designing the product, the electromechanical coupling coefficient $K^2$ can be adjusted with the propagation angle ψ, as in the case in which SH boundary waves are used as the main mode.

FIGS. 37 to 40 are representations of the relationships of φ of the Euler angles (φ, 30°, 0°) with the acoustic velocity of boundary acoustic waves, the electromechanical coupling coefficient $K^2$, the propagation loss, and the frequency temperature coefficient TCF, respectively, obtained in the same manner as FIGS. 21 to 24.

FIGS. 37 to 40 and crystalline symmetry show that when the Euler angle φ is in the ranges of approximately −32°>φ>32° and approximately 88°>φ>152°, the electromechanical coupling coefficient $K^2$ for SH boundary waves is reduced to about 1% or less; and when the Euler angle is in the ranges of approximately −21°>φ>21° and approximately 95°>φ>145°, the electromechanical coupling coefficient $K^2$ for SH boundary waves is advantageously reduced to about 0.5% or less. Still more advantageously, the electromechanical coupling coefficient $K^2$ for SH boundary waves is reduced to about 0.1% or less in the ranges of approximately −9°>φ>9° and approximately 111°>φ>129°; and further, when the Euler angle φ is φ=0° or φ=120°, the electromechanical coupling coefficient $K^2$ for SH boundary waves becomes about 0% or an optimum value, and the electromechanical coupling coefficient $K^2$ of P+SV boundary waves is increased to about 3.9% or more.

The IDT electrode may include first metal layers having a relatively high density and second metal layers having a relatively low density that are alternately stacked one on top of another. An Al layer may be added to the stack of the metal layers, as long as the stack includes at least one layer of a metal having a density of about 3000 kg/m³ to about 21500 kg/m³.

Figure 47:
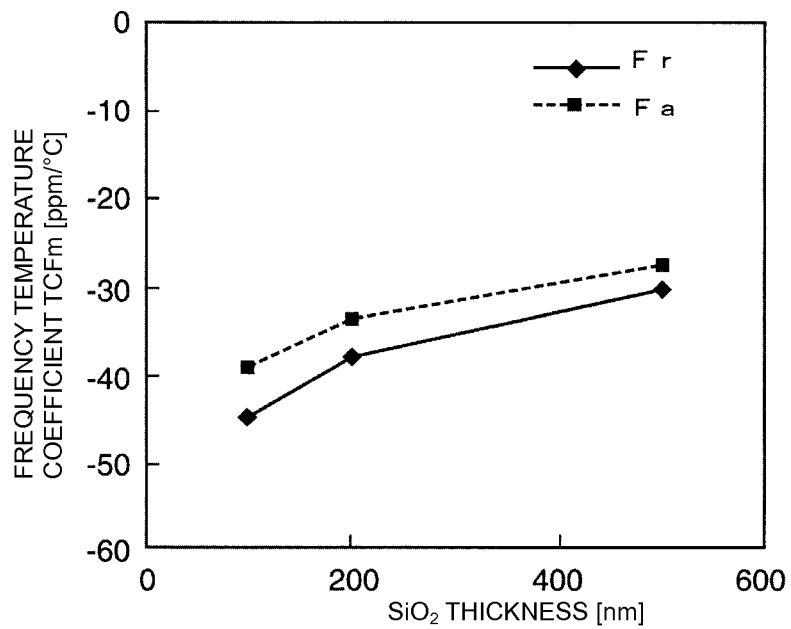
FIG. 47 is a representation of the changes in frequency temperature coefficient TCF (ppm/° C.) with SiO$_2$ thickness in a SiN/SiO$_2$/IDT/LiNbO$_3$ multilayer structure.
Figure 48:
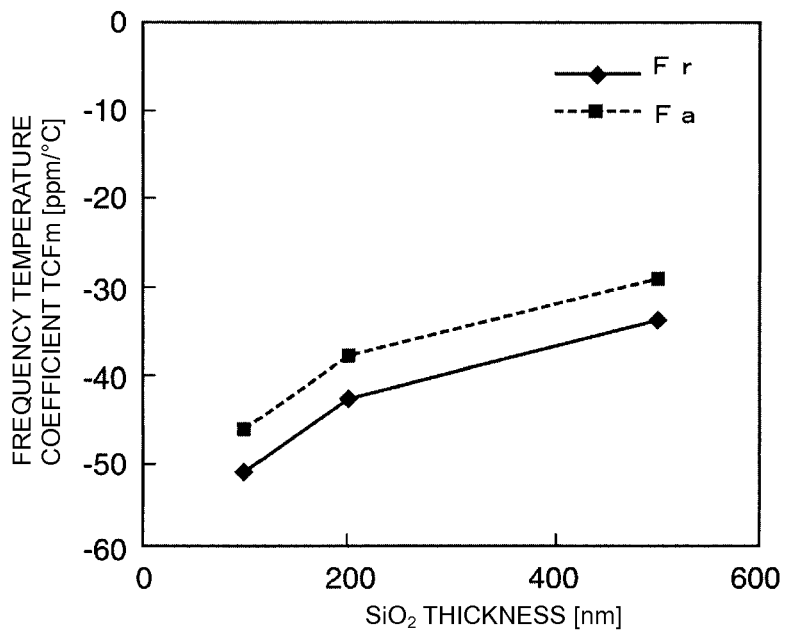
FIG. 48 is a representation of the changes in frequency temperature coefficient TCF (ppm/° C.) with SiO$_2$ thickness in a PSi/SiO$_2$/IDT/LiNbO$_3$ multilayer structure.

FIGS. 41 to 46 are representations of the measurement results of the resonance characteristics of the boundary acoustic wave device 10 according to the preferred embodiment described above. FIGS. 47 and 48 are representations of the measurement results of frequency temperature coefficient.

The boundary acoustic wave devices that produced the results shown in FIGS. 41 to 46 and FIGS. 47 and 48 had the following structure:

First medium 11: LiNbO₃ with a thickness of about 370 μm;

Third medium 13: SiO₂ with a thickness of about 100 nm, about 200 nm, or about 500 nm;

Second medium 12: SiN or poly Si (PSi) with a thickness of about 3.0 μm; and

IDT 14: having a multilayer structure of five layers: Al/Ti/Ni/Au/Ni with thicknesses of approximately 100/10/10/45/10 nm, respectively.

The IDT 14 had 60 pairs of electrode fingers, and the reflectors 15 and 16 had 51 electrode fingers. The overlap of the IDT 14 was about 30λ and the aperture width was about 30.4λ. The IDT 14 was weighted by varying the finger overlap amount such that the center overlap was about 30λ and the overlap amount at both ends in the direction in which boundary acoustic waves propagate was about 15λ.

The distance between the centers of electrode fingers between the IDT 14 and the reflectors 15 and 16 was about 1.6 μm and the pitch of the electrode fingers of the IDT 14 and the reflectors 15 and 16 was about 0.8 μm. The electrode fingers had a line width of about 0.4 μm, and the spaces between the electrode fingers were about 0.4 μm in the direction in which boundary waves propagate.

FIGS. 41 to 43 and 47 show the results of a structure including a SiN second medium 12, and FIGS. 44 to 46 and 48 show the results of a structure including a PSi second medium 12.

As is clear from FIGS. 41 to 46, superior resonance characteristics can be obtained in both cases in which the thicknesses of the SiO₂ layer and the SiN layer are varied and in which the thicknesses of the SiO₂ layer and the poly Si (PSi) layer are varied.

As is clear from FIGS. 47 and 48, the resonant frequency temperature characteristics and the anti-resonant frequency temperature characteristics (TCF) are controlled by varying the thickness of the SiO₂ layer. In particular, the absolute value of the frequency temperature coefficient TCF can be advantageously reduced by increasing the thickness of the SiO₂ layer.

The present invention is not limited to the boundary acoustic wave resonator having the electrode structure shown in FIG. 1, and may be applied to other boundary acoustic wave resonators having other electrode structures. The present invention is not also limited to resonators, and may be applied to a variety of filter devices using boundary acoustic waves, such as ladder-type filters, longitudinally coupled resonator filters, laterally coupled resonator filters, transversal filters, and boundary acoustic wave optical filters, and further applied to switching elements, such as boundary acoustic wave optical switches.

Figure 52:
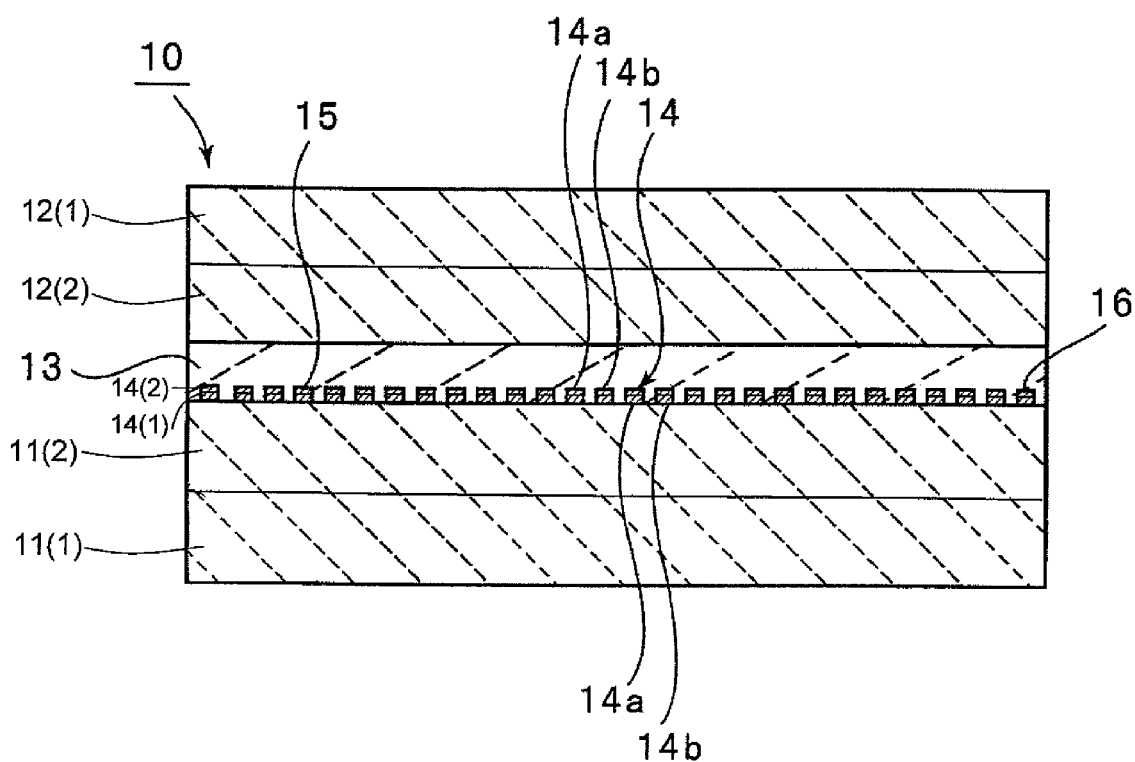
FIG. 52 is a sectional plan view of a boundary acoustic wave device according to another preferred embodiment of the present invention.

The material of the electrodes is not limited to Pt, Au, Ag, and Cu, and other metals having a higher density ρ than Al can be used, such as Ni, Ti, Fe, W, and Ta. The electrodes may include an additional thin layer made of a metal exhibiting high adhesion, such as Ti, Cr, NiCr, or Ni at the medium side to increase the adhesion to the mediums or the electric power resistance. Alternatively, the electrodes, such as the IDT 14, may have a multilayer structure including metal layers 14(1) and 14(2) as shown in FIG. 52, and such a thin adhesion layer may be disposed between the metal layers.

If the IDT 14 is formed of a conductive material having a high density for a frequency band of over 1 GHz, the conductive material for the IDT may be formed to an excessively small thickness, and the electrode finger strips can have a high resistance. For this disadvantage, the resistance of the electrode can be reduced by forming a multilayer structure of second medium/third medium/multilayer metal IDT/first medium including the multilayer IDT of a low-density conductive material and a high-density conductive material, such as Al and Au.

In addition, high-density metals help vibrational energy concentrate in the vicinity of the IDT. Accordingly, the electromechanical coupling coefficient can be increased and thus the same effects as in the above-described preferred embodiments can be produced.

Before forming the second medium and the third medium, the thickness of the IDT may be adjusted to control the frequency by a variety of techniques, such as reverse sputtering, ion beam milling, reactive ion etching, and wet etching.

The thickness of the third medium may be further reduced by milling, etching or the like, or may be increased by deposition, such as sputtering or evaporation, and thus the frequency can be controlled.

The first to third media 11 to 13 may be formed of various types of materials including insulating materials and piezoelectric materials, such as Si, glass, SiO₂, SiC, ZnO, Ta₂O₅, lead zirconate titanate ceramic, AlN, Al₂N, Al₂O₃, LiTaO₃, and KN, without being limited to the above-described materials.

The media may each have a multilayer structure composed of a plurality of media. For example, as shown in FIG. 52, the first medium 11 may include media 11(1) and 11(2) and the second medium 12 may include media 12(1) and 12(2). In preferred embodiments of the present invention, it is preferable that the acoustic velocity in the IDT 14 be much lower than that in the third medium.

If the third medium 13 or first medium 11 in contact with the IDT 14 has piezoelectric characteristics, the electromechanical coupling coefficient $K^2$ for boundary acoustic waves can be advantageously increased.

A protective layer for preventing corrosive gases from permeating may be provided outside the first medium 11/IDT/piezoelectric material structure to enhance the strength of the boundary acoustic wave device. The boundary acoustic wave device may be enclosed in a package in some cases. The protective layer is not particularly limited, and can be made of a synthetic resin, such as polyimide resin or epoxy resin, an inorganic insulating material, such as titanium oxide, aluminum nitride or aluminum oxide, or a metal, such as Au, Al or W.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a multilayer structure including a first medium having piezoelectric characteristics, a non-electroconductive second medium, and a third medium through which slow transverse waves propagate at a lower acoustic velocity than slow transverse waves propagating through the first and second media, the first medium, the third medium and the second medium being stacked in that order; and
   an IDT disposed between the first medium and the third medium; wherein
   the IDT includes a metal layer made of a metal having a density ρ in the range of about 3000 kg/m³ to about 21500 kg/m³; and
   the IDT has electrode fingers arranged at a pitch of λ and has a thickness H1 satisfying the relationship of approximately $0.006\lambda \leq H1 \leq 0.2\lambda$, and the third medium has a thickness H2 satisfying the relationship of approximately $H1 < H2 \leq 0.7\lambda$; and
   the thickness H1 of the IDT is set such that an acoustic velocity of boundary acoustic waves is less than or equal to the lowest value of the acoustic velocities of longitudinal waves, fast transverse waves and slow transverse waves.

2. The boundary acoustic wave device according to claim 1, wherein the thickness H2 of the third medium satisfies the relationship of approximately $H1 < H2 < 0.5\lambda$.

3. The boundary acoustic wave device according to claim 1, wherein the third medium is made of $SiO_2$ or a material mainly containing $SiO_2$.

4. The boundary acoustic wave device according to claim 1, wherein the first medium is made of $LiNbO_3$ and has Euler angles [φ, θ, ψ] satisfying the relationships of approximately −25°<φ<25°, approximately 92°<θ<114, and approximately −60°<ψ<60°.

5. The boundary acoustic wave device according to claim 1, wherein the first medium is made of $LiNbO_3$, and has Euler angles [φ, θ, ψ] satisfying the relationships of approximately −25°<φ<25°, approximately 92°<θ<114°, and approximately 60°<ψ<120°.

6. The boundary acoustic wave device according to claim 1, wherein the first medium is made of $LiNbO_3$ and has Euler angles [φ, θ, ψ] satisfying the relationships of approximately −32°<φ<32°, approximately 15°<θ<41°, and approximately −35°<ψ<35.

7. The boundary acoustic wave device according to claim 1, wherein the IDT is made of a metal selected from the group consisting of Pt, Au, Cu, Ag, Ni, Ti, Fe, W, Ta, and alloys mainly containing those metals.

8. The boundary acoustic wave device according to claim 1, wherein the IDT has a structure including an alternate arrangement of a first metal layer having a relatively high density and a second metal layer having a relatively low density.

9. The boundary acoustic wave device according to claim 8, wherein the first metal layer is disposed at the first medium side.

10. The boundary acoustic wave device according to claim 1, wherein the first medium and/or the second medium has a multilayer structure including a plurality of medium layers.

* * * * *